United States Patent
Sawano

(10) Patent No.: US 9,748,064 B2
(45) Date of Patent: Aug. 29, 2017

(54) FAIL-SAFE CIRCUIT

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Shunichi Sawano, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 199 days.

(21) Appl. No.: 14/784,151

(22) PCT Filed: Apr. 14, 2014

(86) PCT No.: PCT/JP2014/060582
§ 371 (c)(1),
(2) Date: Oct. 13, 2015

(87) PCT Pub. No.: WO2014/175089
PCT Pub. Date: Oct. 30, 2014

(65) Prior Publication Data
US 2016/0056001 A1    Feb. 25, 2016

(30) Foreign Application Priority Data

Apr. 26, 2013  (JP) ................................. 2013-094416
Apr. 26, 2013  (JP) ................................. 2013-094417

(51) Int. Cl.
*G06F 19/00* (2011.01)
*H01H 47/00* (2006.01)
(Continued)

(52) U.S. Cl.
CPC ............. *H01H 47/002* (2013.01); *G06F 1/24* (2013.01); *H03K 19/007* (2013.01)

(58) Field of Classification Search
CPC ....... H01H 47/002; G06F 1/24; H03K 19/007
See application file for complete search history.

(56) References Cited

U.S. PATENT DOCUMENTS 5,375,027 A * 12/1994 Bledsoe ................. H01H 9/548
307/132 EA
5,408,643 A * 4/1995 Katayose ............ G06F 11/0721
714/55

(Continued)

FOREIGN PATENT DOCUMENTS

JP    H01-184502 A    7/1989
JP    H06-314101 A    11/1994
(Continued)

OTHER PUBLICATIONS

Jul. 8, 2014 International Search Report issued in International Patent Application No. PCT/JP2014/060582.

*Primary Examiner* — Kenneth B Wells
(74) *Attorney, Agent, or Firm* — Oliff PLC

(57) ABSTRACT

A fail-safe circuit enables a switch to turn on/off according to a signal from an external device if a microcomputer that controls the turning on/off of the switch falls into an abnormal state and is reset, and if the power supply for a circuit that backs up the control of the switch is lost. The fail-safe circuit includes a microcomputer that controls the turning on/off of a switch based on an instruction signal from an input terminal, a watchdog circuit that generates a reset signal based on a watchdog pulse from the microcomputer, and a transistor for masking a watchdog pulse for resetting a flip-flop circuit that is set by the reset signal. If a voltage supplied by a power supply circuit is lost, a transistor turns off, and therefore the switch turns on/off according to an (Continued)

instruction signal supplied to an output terminal via a resistor and a diode.

10 Claims, 9 Drawing Sheets

(51) Int. Cl.
    *G06F 1/24*          (2006.01)
    *H03K 19/007*     (2006.01)

(56) References Cited

U.S. PATENT DOCUMENTS

| | | | |
|---|---|---|---|
| 7,369,926 B2 * | 5/2008 | Hashimoto | G06F 1/30 701/1 |
| 7,890,227 B2 * | 2/2011 | Sayama | H02J 9/061 701/1 |
| 2011/0043180 A1 | 2/2011 | Babasaki et al. | |

FOREIGN PATENT DOCUMENTS

| | | |
|---|---|---|
| JP | 2003-133936 A | 5/2003 |
| JP | 2009-261153 A | 11/2009 |
| WO | 2009/128525 A1 | 10/2009 |

\* cited by examiner

FAIL-SAFE CIRCUIT

CROSS-REFERENCE TO RELATED APPLICATIONS

This application is a National Stage application of International Application No. PCT/JP2014/060582 filed Apr. 14, 2014, and claims priority to Japanese Patent Application No. 2013-094416 filed on Apr. 26, 2013 and Japanese Patent Application No. 2013-094417 on Apr. 26, 2013, the disclosures of which are incorporated herein by reference in their entireties.

TECHNICAL FIELD

Embodiments of the present application relate to a fail-safe circuit that operates if a control circuit for controlling the turning on/off of a switch based on a signal from an external device is reset.

BACKGROUND

In a control circuit that employs a microcomputer (hereinafter, called a microcomputer) for example, a configuration is generally employed in which a watchdog pulse is periodically output from the microcomputer, the output state of the watchdog pulse is monitored by a monitoring circuit, and a reset signal is supplied by the monitoring circuit to the microcomputer if it is determined that the operation of the microcomputer is abnormal.

It is often the case that immediately after the microcomputer has been reset, the level of the output signal output to a load whose on/off state is controlled by the microcomputer is fixed to H (High) or L (Low). Here, for example, in the case of a load that falls into an undesirable state if the control circuit malfunctions and the load is fixedly controlled so as to be only either off or on, such as a headlight or horn installed in a vehicle, the control circuit is equipped with a backup function so that the control performed by the microcomputer can be turned on/off with a different system according to an external instruction that is based on a user operation (see JP 2009-261153A).

FIG. 9 is a circuit diagram showing the configuration of a conventional backup system according to JP 2009-261153A. For example, one end of a combination switch 81 arranged in the console portion of the driver's seat or the like is connected to the input terminal of a microcomputer 73 included in an ECU 7 in the engine room, via a microcomputer 83 of an in-compartment ECU 82 and one input terminal and the output terminal of an OR gate 71, and is also connected to the other input terminal of the OR gate 71 and one input terminal of an AND gate 72. One output terminal of the microcomputer 73 is connected to a semiconductor device 76 via one input terminal and the output terminal of an OR gate 75, and the other output terminal, which outputs a watchdog pulse, is connected to the input terminal of a watchdog circuit 74. The output terminal of the watchdog circuit 74 is connected to the other input terminal of the AND gate 72, and outputs an L-level signal when the microcomputer 73 is in the normal state. The output terminal of the AND gate 72 is connected to the other input terminal of the OR gate 75. An in-vehicle power supply 84 is connected to the power supply terminal of the semiconductor device 76, and a load 85 is connected to the output terminal. In general, the microcomputer 73 is predominantly a microcomputer driven with 5 V, and the microcomputer 73, the watchdog circuit 74, and peripheral gate circuitry receive a supply of power from a power supply IC that generates a 5V voltage by stepping down the voltage of a battery (not shown).

In FIG. 9, if the combination switch 81 is turned on while an abnormality has not be detected in the microcomputer 73, the semiconductor device 76 turns on according to a signal from one output terminal of the microcomputer 73, and the load 85 is turned on. On the other hand, if the microcomputer 73 falls into an abnormal state and a watchdog pulse is no longer output from the other output terminal, the watchdog circuit 74 supplies an H-level signal to the other input terminal of the AND gate 72, and therefore the signal from the combination switch 81 is supplied to the other input terminal of the OR gate 75 via the AND gate 72 included in a backup line 70. For this reason, even if the microcomputer 73 loses the ability to control the semiconductor device 76, the turning on/off of the load 85 can be controlled by turning the combination switch 81 on/off.

SUMMARY OF THE INVENTION

However, with the ECU 7 in the engine room according to JP 2009-261153A, in the case where, for example, the microcomputer 73 is reset based on an H-level signal being supplied by the output terminal of the watchdog circuit 74 to the other input terminal of the AND gate 72, normally the microcomputer 73 starts to output the watchdog pulse immediately after the reset is released, and the watchdog circuit 74 supplies an L-level signal to the other input terminal of the AND gate 72. For this reason, there has been a problem in that from when the microcomputer 73 starts to output the watchdog pulse until when the microcomputer 73 ends initialization processing for example, the backup line 70 is closed, and the load 85 can be controlled by neither the microcomputer 73 nor the backup line 70. Furthermore, there has been a problem in that if the aforementioned power supply IC malfunctions and a 5V voltage is no longer generated, the backup line 70 itself no longer operates.

Embodiments of the present application have been achieved in light of these circumstances, and an object thereof is to provide a fail-safe circuit that allows a switch to be turned on/off according to a signal from an external device in the case where the microcomputer that controls the turning on/off of the switch falls into an abnormal state and is reset, and in the case where the power supply for the circuit that performs backup control of the switch is lost.

A fail-safe circuit according to embodiments of the present application is a fail-safe circuit including a control circuit that controls a turning on/off of a switch based on an instruction signal from the outside instructing a turning on/off of the switch, and a watchdog circuit that generates a reset signal for resetting the control circuit based on a watchdog pulse generated by the control circuit, the fail-safe circuit performing a fail-safe operation based on the reset signal generated by the watchdog circuit, the fail-safe circuit including: a flip-flop circuit that is respectively set and reset upon receiving the reset signal and the watchdog pulse; and a mask circuit for masking the watchdog pulse that is to be input to the flip-flop circuit, wherein in a case of being reset by the reset signal, the control circuit masks the watchdog pulse using the mask circuit from when the reset is released until starting to control a turning on/off of the switch, and in a case where the flip-flop circuit was set by the reset signal, and in a case where a power supply for supplying power to the flip-flop circuit was turned off, the switch is turned on/off according to the instruction signal.

According to embodiments of the present application, the turning on/off of the switch is instructed by an instruction signal from an external device, and the control circuit controls the turning on/off of the switch as well as generates a watchdog pulse by unique control that is based on the instruction signal. If the control circuit is reset by the reset signal that the watchdog circuit generated based on the watchdog pulse, the flip-flop circuit is set. The flip-flop circuit is reset by a watchdog pulse received via the mask circuit. The control circuit masks the watchdog pulse using the mask circuit from when the reset is released until starting to control the turning on/off of the switch. If the flip-flop circuit is set by the reset signal, and if the power supply for supplying power to the flip-flop circuit is lost, the switch is turned on/off according to the instruction signal, independently of control performed by the control circuit.

In other words, if the control circuit loses the ability to perform control, and the watchdog pulse is no longer generated, the reset signal is supplied to the control circuit, and the turning on/off of the switch is no longer controlled, but since the flip-flop circuit is set by the reset signal, a fail-safe state is achieved in which the switch is turned on/off according to the instruction signal itself. In the period from when the reset of the control circuit is released and operation of the control circuit resumes, until when the control circuit starts to control the turning on/off of the switch, the watchdog pulse is masked by the mask circuit, and thus the flip-flop circuit is held in the set state, and the fail-safe state continues. Additionally, even if the flip-flop circuit stops being set due to the power supply no longer being supplied to the flip-flop circuit, the switch is turned on/off according to the instruction signal itself.

In a fail-safe circuit according to embodiments of the present application, the control circuit and the watchdog circuit receive a supply of power from the power supply.

In the embodiments of the present application, the control circuit, the watchdog circuit, and the flip-flop circuit receive a supply of power from the same power supply, and therefore the overall power supply system is simplified, the behavior when the power supply is lost is clear, and the circuit for ensuring the fail-safe operation is simplified.

In a fail-safe circuit according to embodiments of the present application, the control circuit includes a microcomputer, and the mask circuit and the switch are respectively controlled by signals output from output ports of the microcomputer.

In the embodiments of the present application, the mask circuit and the switch are respectively controlled by signals output from output ports of the microcomputer.

Specifically, the mask signal supplied to the mask circuit and the control signal for controlling the on/off state of the switch are output by the output ports of the microcomputer, and therefore it is possible to simplify the circuit configuration, and the behavior of the control circuit including the microcomputer when the power supply is lost is clear.

In a fail-safe circuit according to embodiments of the present application, the instruction signal is a signal indicating a turning on/off of the switch according to a signal level.

In the embodiments of the present application, the turning on/off of the switch is instructed by the high/low (or low/high) state of the signal level of the instruction signal, and thus the circuit configuration is simpler than in the case where the turning on/off of the switch is instructed by the content of a data signal, for example.

According to embodiments of the present application, from when the reset of the control circuit is released and operation of the control circuit resumes, until when the control circuit starts to control the turning on/off of the switch, the watchdog pulse is masked by the mask circuit, and thus the flip-flop circuit is held in the set state, and the fail-safe state persists.

Accordingly, the switch can be turned on/off according to a signal from an external device in the case where the microcomputer that controls the turning on/off of the switch falls into an abnormal state and is reset, and in the case where the power supply for the circuit that performs backup control of the switch is lost.

DETAILED DESCRIPTION

Hereinafter, the present application will be described in detail with reference to drawings showing embodiments of the present application.

Embodiment 1

Figure 1:
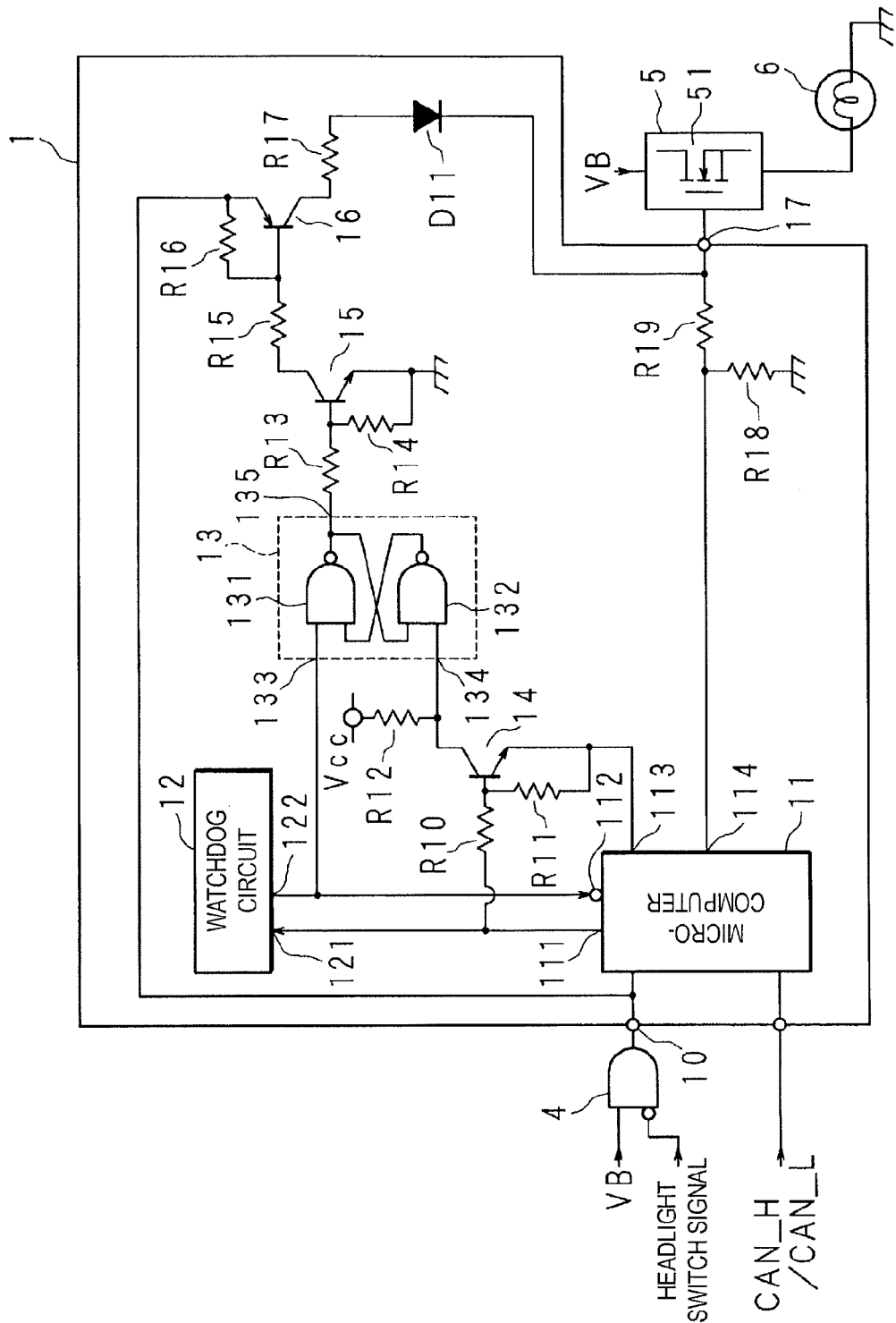
FIG. 1 is a circuit diagram showing an example of a configuration of a fail-safe circuit according to Embodiment 1 of the present application.

FIG. 1 is a circuit diagram showing an example of the configuration of a fail-safe circuit according to Embodiment 1 of the present application. 1 in this figure is a fail-safe circuit, and the fail-safe circuit 1 includes a microcomputer (corresponding to a control circuit) 11 that controls the turning on/off of a switch 5, which is constituted by a semiconductor relay, based on an instruction signal received from an external AND gate 4 via an input terminal 10, a watchdog circuit 12 that generates a low-active reset signal based on a high-active watchdog pulse generated by the microcomputer 11, and a flip-flop circuit 13 that is constituted by NAND gates 131 and 132. The microcomputer 11 is not limited to being a computer, and may be a circuit constituted by components such as PLDs (Programmable Logic Devices) or general-purpose logic ICs.

An output port 111 of the microcomputer 11, which outputs a watchdog pulse, is connected to an input terminal 121 of the watchdog circuit 12 and one end of a resistor R10. An output terminal 122 of the watchdog circuit 12, which outputs a reset signal, is connected to a reset terminal 112 of the microcomputer 11 and a set terminal 133 of the flip-flop circuit 13. The other end of the resistor R10 is connected to the base of an NPN transistor 14. A resistor R11 is connected between the base and the emitter of the transistor 14. The collector of the transistor 14 is pulled up to a 5V voltage Vcc by a resistor R12, and is connected to a reset terminal 134 of the flip-flop circuit 13.

The flip-flop circuit 13 has a configuration in which the output terminal of a NAND gate 131 is connected to one input terminal of a NAND gate 132, and the output terminal of the NAND gate 132 is connected to one input terminal of the NAND gate 131. In Embodiment 1, the other input terminals of the NAND gates 131 and 132 are respectively a set terminal 133 and a reset terminal 134 of the flip-flop circuit 13, and the output terminal of the NAND gate 131 is the output terminal (so-called Q terminal) 135 of the flip-flop circuit 13. The Q terminal 135 is set if a low-active signal is supplied exclusively to the set terminal 133, and is reset if a low-active signal is supplied exclusively to the reset terminal 134.

The Q terminal 135 of the flip-flop circuit 13 is connected to the base of an NPN transistor 15 via a resistor R13. A resistor R14 is connected between the base and the emitter of the transistor 15. The collector of the transistor 15 is connected to the base of a PNP transistor 16 via a resistor R15. A resistor R16 is connected between the base and the emitter of the transistor 16. The emitter of the transistor 16 is connected to the input terminal 10 of the fail-safe circuit 1, and receives an instruction signal from an external device. The collector of the transistor 16 is connected to an output terminal 17 of the fail-safe circuit 1 via a resistor R17 and a forward diode D11.

An output port 113 of the microcomputer 11 is connected to the emitter of the transistor 14. An output port 114 of the microcomputer 11 is pulled down to ground potential by a resistor R18, and is connected to the output terminal 17 by a resistor R19. The resistance value of the resistor R19 is sufficiently higher than the resistance value of the resistor R17, and the diode D11 and the resistor R19 configure an OR circuit. The microcomputer 11 is equipped with a driver and receiver for CAN communication, and is connected to a CAN_H line and a CAN_L line in a CAN bus. If the microcomputer 11 is not equipped with the aforementioned driver and receiver, it is sufficient to connect to the CAN_H line and the CAN_L line via an external driver and receiver.

If the signal supplied by the output port 113 of the microcomputer 11 to the emitter of the transistor 14 is at the low level, the transistor 14 performs inversion amplification on the watchdog pulse supplied to the base via the resistor R10, and supplies a low-active watchdog pulse to the reset terminal 134 of the flip-flop circuit 13. However, if the signal supplied by the output port 113 of the microcomputer 11 to the emitter is at the high level, the transistor 14 does not perform inversion amplification on the watchdog pulse, and holds the reset terminal 134 at the high level. In other words, the transistor 14 configures a mask circuit, the signal output from the output port 113 of the microcomputer 11 is a mask signal, and the microcomputer 11 operates so as to mask the watchdog pulse with use of the transistor 14.

If the Q signal output from the Q terminal 135 of the flip-flop circuit 13 rises to the high level, and the instruction signal supplied to the emitter of the transistor 16 via the input terminal 10 has risen to the high level, the transistors 15 and 16 supply a high-level signal to the series circuit constituted by the diode D11 and the resistor R17. In other words, the transistors 15 and 16 configure an AND circuit that takes the AND of the Q signal and the instruction signal.

An in-vehicle battery voltage VB is applied to one input terminal of the external AND gate 4, and a low-active headlight switch signal is supplied by a headlight switch (not shown) to the other input terminal. Accordingly, the AND gate 4 generates an instruction signal whose signal level is high or low according to whether the headlight switch signal is to be on (low) or off (high). In other words, the turning on/off of the switch 5 is instructed by the signal level of the instruction signal. The signal level of the instruction signal is adjusted so as to match the input signal level of the microcomputer 11.

The microcomputer 11 basically outputs a switch control signal for controlling the on/off state of the switch 5 from the output port 114, according to the on/off state of the instruction signal received via the input terminal 10. If an abnormality has been detected based on an unillustrated monitoring signal (e.g., a temperature abnormality signal notified by CAN communication) for example, the microcomputer 11 performs control for turning off (low level) the switch control signal output from the output port 114 regardless of the on/off state of the instruction signal.

The switch 5 has an N-channel MOSFET 51, the voltage VB is applied to one input terminal of the switch 5, and the switch 5 turns on/off the drive voltage applied to a headlight 6 if a high-active drive signal has been supplied by the output terminal 17 of the fail-safe circuit 1 to the control terminal.

Next, a fail-safe operation of the fail-safe circuit 1 will be described.

Figure 2:
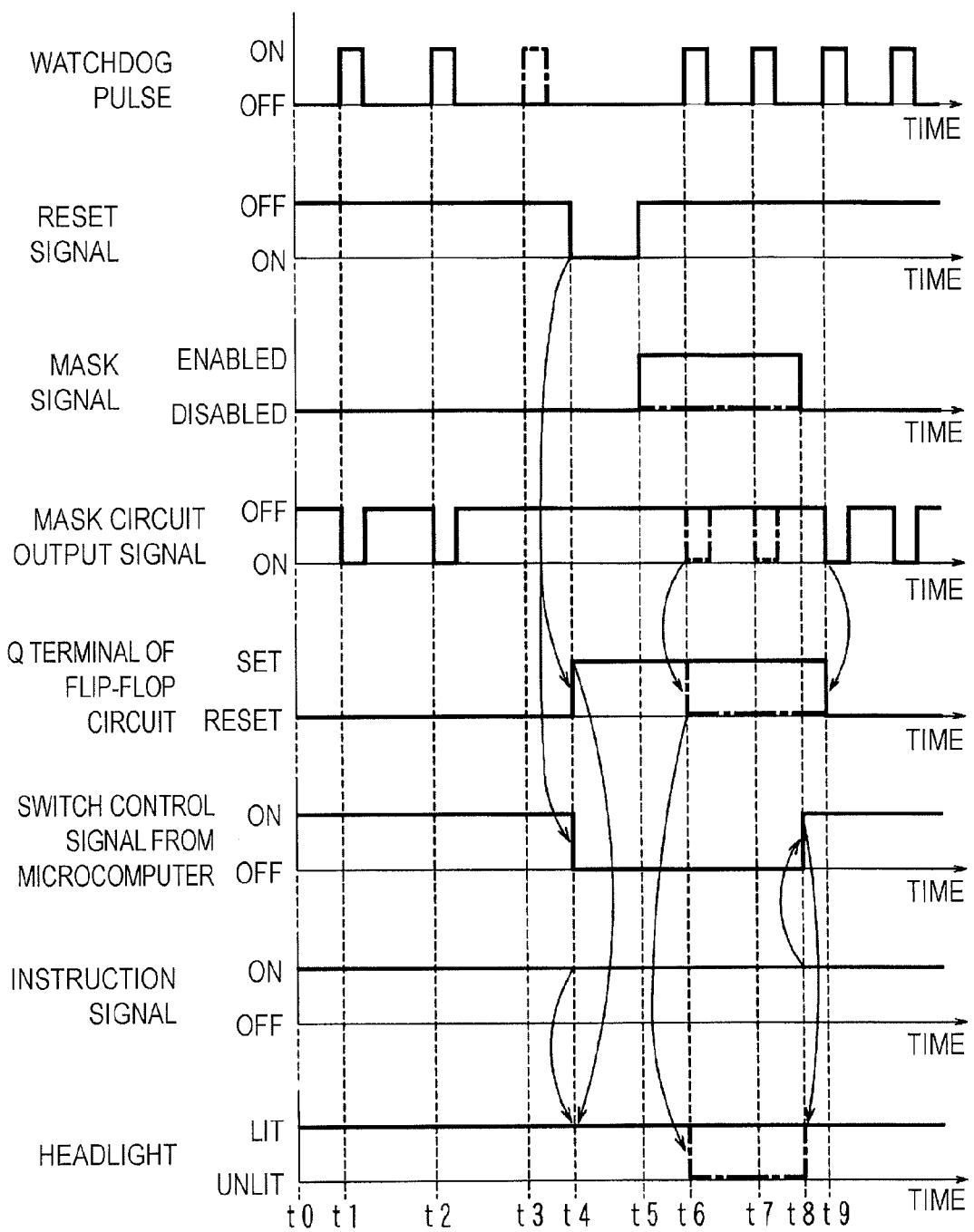
FIG. 2 is a timing chart for describing operations of the fail-safe circuit according to Embodiment 1.

FIG. 2 is a timing chart for describing operations of the fail-safe circuit 1 according to Embodiment 1. In the eight timing diagrams shown in FIG. 2, the horizontal axes are all the same time axis, and beginning from the top of the figure, the vertical axes respectively indicate the on/off state of the watchdog pulse, the off/on state of the reset signal, the enabled/disabled state of the mask signal, the off/on state of the mask circuit output signal, the set/reset state of the Q terminal 135 of the flip-flop circuit 13, the on/off state of the switch control signal from the microcomputer 11, the on/off state of the instruction signal, and the lit/unlit state of the headlight 6. The signals indicated as the off/on state are low-active signals. Also, the signals indicated by dashed-dotted lines represent signals that do not appear in Embodiment 1.

In Embodiment 1, it is assumed that the instruction signal received from the input terminal 10 is on, and the headlight 6 accordingly continues to be lit. Specifically, since before a time t0 shown in FIG. 2, the switch control signal output by the microcomputer 11 has been held in the on state (high level), and the Q terminal 135 of the flip-flop circuit 13 has been reset as will be described later. Accordingly, because the AND condition of the AND circuit constituted by the transistors 15 and 16 is not satisfied, the diode D11 is nonconductive, but because the switch control signal (on) from the microcomputer 11 is supplied to the output terminal 17 via the resistor R19, the switch 5 turns on and the headlight 6 continues to be lit. Furthermore, because the microcomputer 11 has been outputting the watchdog pulse substantially periodically since before the time t0, the reset signal output by the watchdog circuit 12 has been held in the off state, and the mask signal output from the output port 113 by the microcomputer 11 has been kept in the low-level disabled state.

If the watchdog pulse rises at a time t1, since the mask signal is disabled, the mask circuit constituted by the transistor 14 performs inversion amplification on the watchdog pulse, and the output signal of the mask circuit falls. This output signal is supplied to the reset terminal 134 of the flip-flop circuit 13, but since the Q terminal 135 of the flip-flop circuit 13 has already been reset, the Q terminal 135 holds this state.

In the case where the watchdog pulse rises at a time t2 as well, a procedure similar to that in the case of rising at the time t1 is performed.

If the watchdog pulse that is to be output from the microcomputer 11 at a time t3 (indicated by a dashed-dotted line) is not output as a result of the microcomputer 11 falling into an abnormal state in the period between the time t2 and the time t3, the watchdog circuit 12 generates a reset signal at a time t4, for example. Accordingly, the microcomputer 11 is reset, the output port 113 is set to the low level, and the mask signal is held in the disabled state. Also, the reset signal is supplied to the set terminal 133 of the flip-flop circuit 13, and thus the Q terminal 135 is set.

Furthermore, due to the microcomputer 11 being reset, the output port 114 is set to the low level, and the switch control signal is set to off. Here, even if the output port 114 temporarily enters a high impedance state due to the microcomputer 11 being reset, the output port 114 is pulled down to ground potential by the resistor R18, and the switch control signal is set to off. In this case, the Q terminal 135 has been set, and the instruction signal is on, and therefore due to the AND condition of the AND circuit constituted by the transistors 15 and 16 being satisfied and the diode D11 becoming conductive, a high-level signal is supplied to the output terminal 17, the switch 5 turns on, and the headlight 6 continues to be lit.

At a time t5, the reset signal output by the watchdog circuit 12 is set to off, the microcomputer 11 whose reset was released starts initialization and sets the output port 113 to the high level, and thus the mask signal becomes enabled. Here, if the output port 113 temporarily enters a high impedance state due to the microcomputer 11 being reset, the transistor 14 is turned off, and therefore the mask signal is enabled in the period from the time t4 to the time t5 as well. The duration of the reset signal can be set using a setting terminal (not shown) of the watchdog circuit 12.

At a time t6, the microcomputer 11 starts to output a watchdog pulse. Here, if the mask signal were always disabled (shown by a dashed-dotted line), that is to say if the emitter of the transistor 14 were always held at the low level, the output signal from the mask circuit constituted by the transistor 14 would fall (shown by a dashed-dotted line), this signal would be supplied to the reset terminal 134 of the flip-flop circuit 13, and the Q terminal 135 would be reset (shown by a dashed-dotted line). In this case, the AND condition of the AND circuit constituted by the transistors 15 and 16 would not be satisfied, and therefore the diode D11 would become nonconductive. However, control of the switch control signal by the microcomputer 11 would not have been resumed, and therefore a low-level signal would be supplied by the output port 114 to the output terminal 17 via the resistor R19, the switch 5 would turn off, and the headlight 6 would become unlit (shown by a dashed-dotted line).

In other words, in Embodiment 1, the turning off of the headlight 6 when the microcomputer 11 is reset is prevented by enabling the mask signal at the time t6.

In the case where the watchdog pulse is output at a time t7 as well, a procedure similar to that in the case of being output at the time t6 is performed.

If, at a time t8, the microcomputer 11 sets the output port 113 to low active to disable the mask signal, and also sets the switch control signal output from the output port 114 to on according to the instruction signal, the switch control signal (on) is supplied to the output terminal 17 via the resistor R19, and thus the switch 5 turns on and the lit state of the headlight 6 is held.

After the mask signal becomes disabled, if the watchdog pulse is output at a time t9, the mask circuit constituted by the transistor 14 performs inversion amplification on the watchdog pulse, and the output signal from the mask circuit falls. This output signal is supplied to the reset terminal 134 of the flip-flop circuit 13, and therefore the Q terminal 135 of the flip-flop circuit 13 is reset. In this case, the AND condition of the AND circuit constituted by the transistors 15 and 16 is not satisfied, and therefore the diode D11 becomes nonconductive, but since the switch control signal has already been set to on, the switch 5 continues to be in the on state, and the lit state of the headlight 6 is held.

The example in which the instruction signal continues to be on in the period from the time t0 to at least the time t9 shown in FIG. 2 is described in Embodiment 1, but if the instruction signal changes from on to off and from off to on in the period from when the microcomputer 11 is reset at the time t4 until when the switch control signal is set to on at the time t8, it goes without saying that the headlight 6 changes from lit to unlit and from unlit to lit according to the instruction signal.

Also, if the instruction signal continues to be off, in the period from the time t0 to the time t9, the switch control signal continues to be off without use of the mask circuit, and the diode D11 becomes nonconductive without the AND condition of the AND circuit constituted by the transistors 15 and 16 becoming satisfied, and therefore the output terminal 17 is set to the low level, and the headlight 6 continues to be unlit.

As described above, according to Embodiment 1, the on/off state of the switch 5 constituted by a semiconductor relay is instructed by an instruction signal from the external AND gate 4, and the microcomputer 11 controls the turning on/off of the switch 5 and generates a watchdog pulse based on the instruction signal and a predetermined monitoring signal. If the microcomputer 11 is reset by a reset signal generated by the watchdog circuit 12 based on the watchdog pulse, the Q terminal 135 of the flip-flop circuit 13 is set. The Q terminal 135 of the flip-flop circuit 13 is reset by a watchdog pulse obtained by inversion amplification performed by the mask circuit. In the period from when the reset is released until when control of the on/off state of the switch 5 starts, the microcomputer 11 outputs the mask signal from the output port 113, and masks the watchdog pulse using the mask circuit. If the Q terminal 135 of the flip-flop circuit 13 is set by the reset signal, the switch is turned on/off according to the instruction signal, independently of control performed by the microcomputer 11.

Specifically, if the microcomputer 11 loses the ability to perform control, and the watchdog pulse is no longer generated, a reset signal is supplied to the microcomputer 11, and the turning on/off of the switch 5 is no longer controlled, but since the Q terminal 135 of the flip-flop circuit 13 is set by the reset signal, a fail-safe state is achieved in which the switch 5 is turned on/off according to the instruction signal itself. In the period from when the reset of the microcomputer 11 is released and operation of the microcomputer 11 resumes, until when the microcomputer 11 starts to control the turning on/off of the switch 5 using the switch control signal, the watchdog pulse is masked by the mask circuit, and thus the Q terminal 135 of the flip-flop circuit 13 is held in the set state, and the fail-safe state continues.

Accordingly, even if the microcomputer 11 that controls the turning on/off of the switch 5 falls into an abnormal state and is reset, the switch 5 can be turned on/off according to a signal from an external device.

Modified Example

Embodiment 1 is an embodiment that is configured using many discrete components such as the transistors 14, 15, and 16 and the diode D11, whereas this modified example of Embodiment 1 is an embodiment that is configured using general-purpose logic ICs whenever possible.

Figure 3:
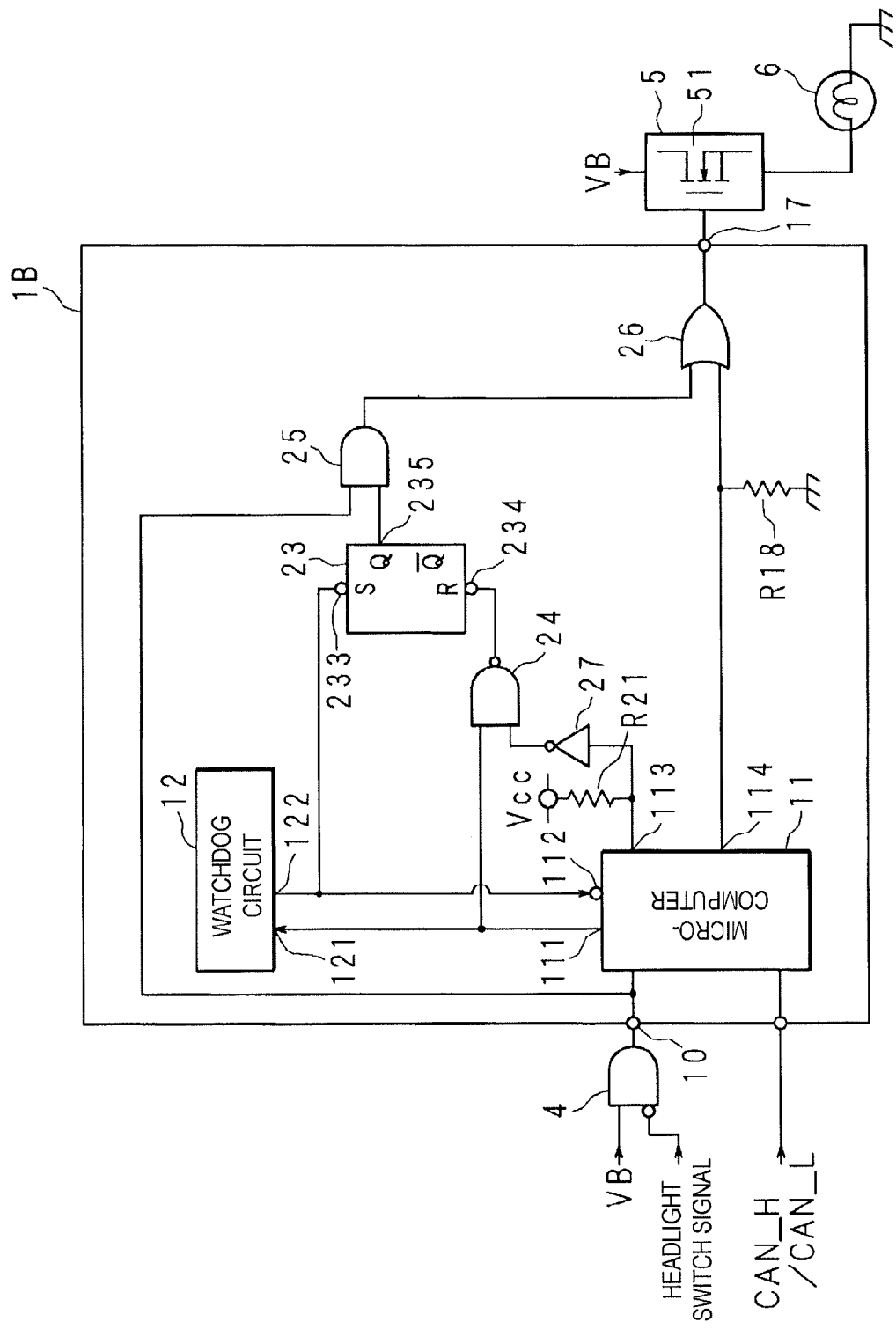
FIG. 3 is a circuit diagram showing an example of a configuration of a fail-safe circuit according to a modified example of Embodiment 1 of the present application.

FIG. 3 is a circuit diagram showing an example of the configuration of a fail-safe circuit according to this modified example of Embodiment 1. 1B in this figure is a fail-safe circuit, and the fail-safe circuit 1B includes the microcomputer 11 that controls the turning on/off of the switch 5, which is constituted by a semiconductor relay, based on an instruction signal received from the external AND gate 4 via the input terminal 10, the watchdog circuit 12 that generates a low-active reset signal based on a high-active watchdog pulse generated by the microcomputer 11, and a flip-flop circuit 23 that is constituted by an SR flip-flop.

The output port 111 of the microcomputer 11, which outputs a watchdog pulse, is connected to the input terminal 121 of the watchdog circuit 12 and one input terminal of a NAND gate 24. The output terminal 122 of the watchdog circuit 12, which outputs a reset signal, is connected to the reset terminal 112 of the microcomputer 11 and a set terminal 233 of the flip-flop circuit 23. The output terminal of the NAND gate 24 is connected to a reset terminal 234 of the flip-flop circuit 23.

A Q terminal 235 of the flip-flop circuit 23 is connected to one input terminal of an AND gate 25. The other input terminal of the AND gate 25 is connected to the input terminal 10 of the fail-safe circuit 1B, and receives an instruction signal from an external device. The output terminal of the AND gate 25 is connected to the output terminal 17 of the fail-safe circuit 1B via one input terminal and the output terminal of an OR gate 26.

The output port 113 of the microcomputer 11 is pulled up to the voltage Vcc by a resistor R21, and is connected to the other input terminal of the NAND gate 24 via an inverter 27. The output port 114 of the microcomputer 11 is pulled down to ground potential by the resistor R18, and is connected to the output terminal 17 via the other input terminal and the output terminal of the OR gate 26.

Other portions that correspond to Embodiment 1 are denoted by the same reference signs, and detailed descriptions will not be given for them.

If the signal supplied by the output port 113 of the microcomputer 11 to the inverter 27 is at the low level, the NAND gate 24 inverts the watchdog pulse supplied to one input terminal thereof, and supplies a low-active watchdog pulse to the reset terminal 234 of the flip-flop circuit 23. However, if the signal supplied by the output port 113 of the microcomputer 11 to the inverter 27 is at the high level, the NAND gate 24 holds the output terminal, which is connected to the reset terminal 234, at the high level. In other words, the NAND gate 24 and the inverter 27 configure a mask circuit, the signal output from the output port 113 of the microcomputer 11 is a mask signal, and the microcomputer 11 operates so as to mask the watchdog pulse with use of the NAND gate 24 and the inverter 27.

The above-described fail-safe circuit 1B is the fail-safe circuit 1 shown in FIG. 1 of Embodiment 1, in which the mask circuit constituted by the transistor 14 has been replaced with the NAND gate 24 and the inverter 27, the AND circuit constituted by the transistors 15 and 16 has been replaced with the AND circuit 25, the OR circuit constituted by the diode D11 and the resistor R19 has been replaced with the OR gate 26, and furthermore the flip-flop circuit 13 constituted by the NAND gates 131 and 132 has been replaced with the flip-flop circuit 23 constituted by an SR flip-flop. Accordingly, the fail-safe operation realized by the fail-safe circuit 1B is entirely the same as the case described using FIG. 2 in Embodiment 1.

Note that if the output port 113 temporarily enters a high impedance state due to the microcomputer 11 being reset, the input terminal of the inverter 27 is set to the high level, the other input terminal of the NAND gate 24 is set to the low level, and the watchdog pulse is masked, and therefore the mask signal becomes enabled in the period from the time t4 to the time t5 shown in FIG. 2 as well.

As described above, this modified example of Embodiment 1 can achieve effects similar to those of the fail-safe circuit 1 according to Embodiment 1.

Embodiment 2

Embodiment 1 and the modified example thereof are embodiments in which the output port 114 of the microcomputer 11 is pulled down to ground potential by the resistor R18, and the turning off of the headlight 6 when the microcomputer 11 is reset is prevented. However, Embodiment 2 is an embodiment in which the output port 114 of the microcomputer 11 is an open drain (or an open collector) and is pulled up by another resistor, and the turning on of the headlight 6 when the microcomputer 11 is reset is prevented. In Embodiment 2, it is assumed that the output port 113 is also an open drain (or an open collector).

Figure 4:
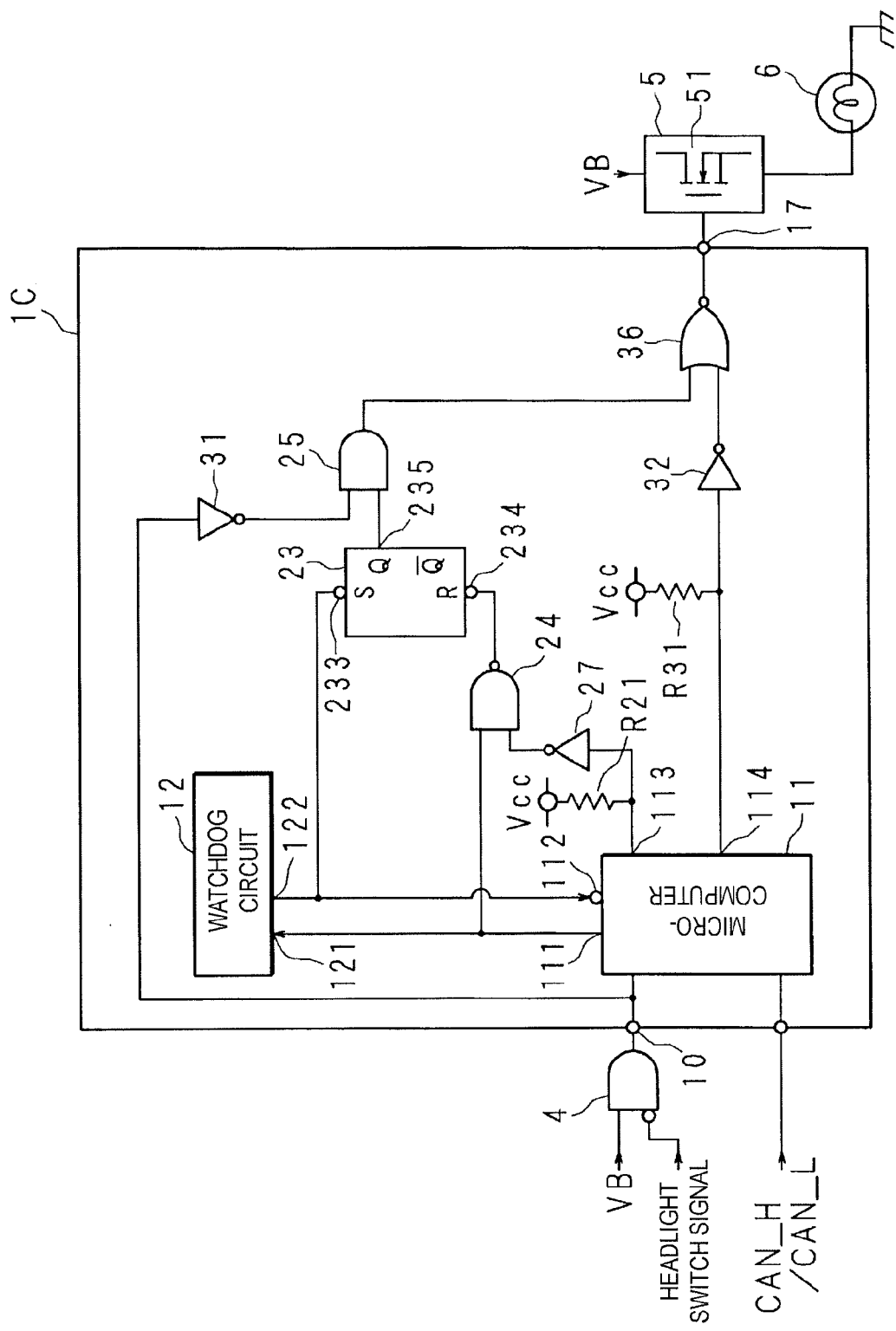
FIG. 4 is a circuit diagram showing an example of a configuration of a fail-safe circuit according to Embodiment 2 of the present application.

FIG. 4 is a circuit diagram showing an example of the configuration of a fail-safe circuit according to Embodiment 2 of the present application. 1C in this figure is a fail-safe circuit, and the fail-safe circuit 1C includes the microcomputer 11 that controls the turning on/off of a switch 5, which is constituted by a semiconductor relay, based on an instruction signal received from the external AND gate 4 via the input terminal 10, the watchdog circuit 12 that generates a low-active reset signal based on a high-active watchdog pulse generated by the microcomputer 11, and the flip-flop circuit 23 that is constituted by an SR flip-flop.

The output port 111 of the microcomputer 11, which outputs a watchdog pulse, is connected to the input terminal 121 of the watchdog circuit 12 and one input terminal of the NAND gate 24. The output terminal 122 of the watchdog circuit 12, which outputs a reset signal, is connected to the reset terminal 112 of the microcomputer 11 and the set terminal 233 of the flip-flop circuit 23. The output terminal of the NAND gate 24 is connected to the reset terminal 234 of the flip-flop circuit 23.

The Q terminal 235 of the flip-flop circuit 23 is connected to one input terminal of the AND gate 25. The other input terminal of the AND gate 25 is connected to the output terminal of an inverter 31 that inverts a signal from the input terminal 10 of the fail-safe circuit 1C, and receives an inverted instruction signal from an external device. The output terminal of the AND gate 25 is connected to the output terminal 17 of the fail-safe circuit 1C via one input terminal and the output terminal of a NOR gate 36.

The output port 113 of the microcomputer 11, which is an open drain (or open collector), is pulled up to the voltage Vcc by the resistor R21, and is connected to the other input terminal of the NAND gate 24 via the inverter 27. The output port 114 of the microcomputer 11, which is an open drain (or an open collector), is pulled up to the voltage Vcc by a resistor R31, and is connected to the output terminal 17 via the other input terminal and the output terminal of the NOR gate 36.

Other portions that correspond to Embodiment 1 and the modified example thereof are denoted by the same reference signs, and detailed descriptions will not be given for them.

The above-described fail-safe circuit 1C is the fail-safe circuit 1B shown in FIG. 3 of the modified example of Embodiment 1, in which the inverter 31 has been arranged upstream of the other input terminal of the AND gate 25, the OR gate 26 has been replaced with the NOR gate 36, the resistor R18 that pulls down the output port 114 of the microcomputer 11 has been replaced with the pull-up resistor R31, and furthermore the inverter 32 has been arranged between the output port 114 and the NOR gate 36.

Next, a fail-safe operation of the fail-safe circuit 1C will be described.

Figure 5:
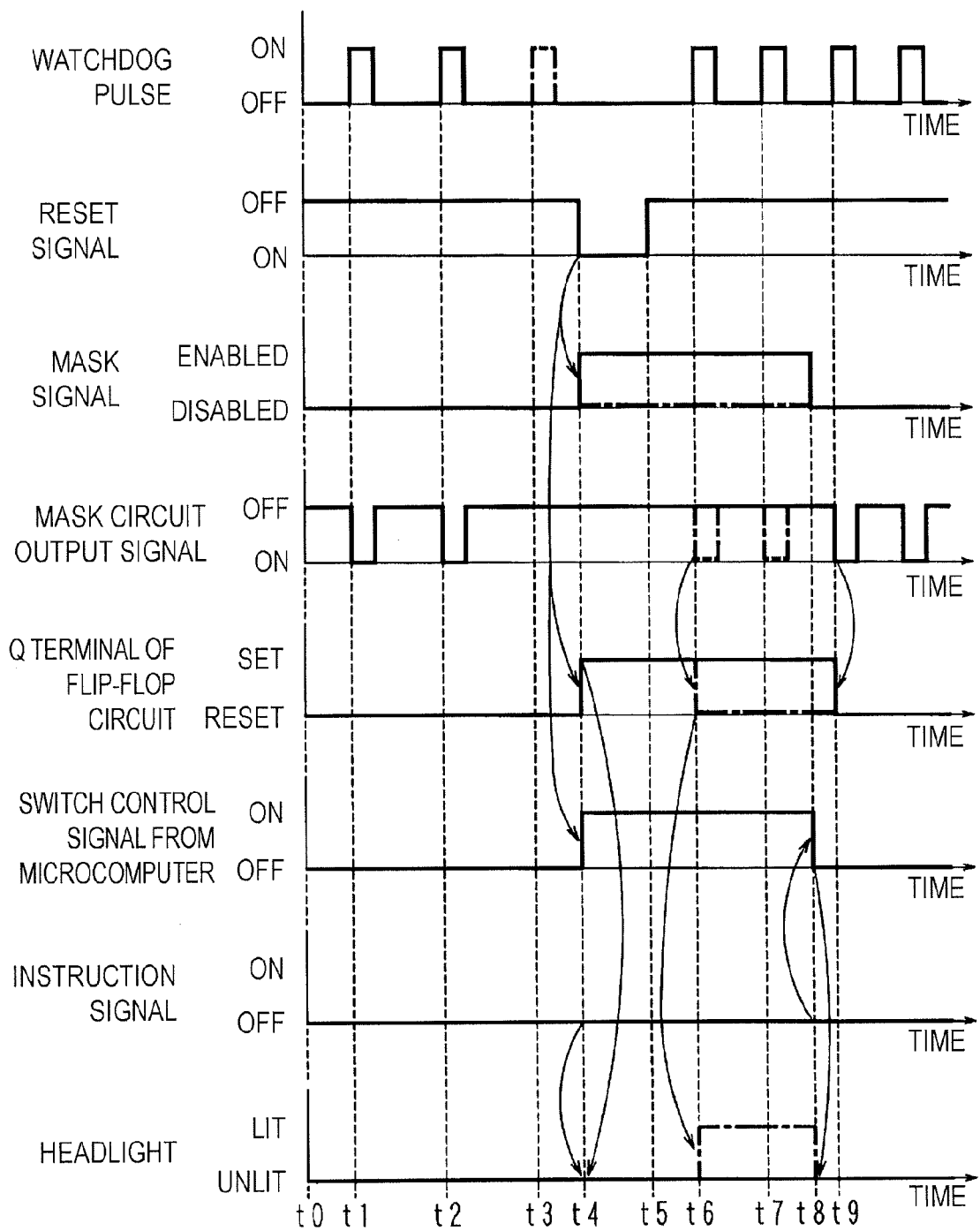
FIG. 5 is a timing chart for describing operations of the fail-safe circuit according to Embodiment 2.

FIG. 5 is a timing chart for describing operations of the fail-safe circuit 1C according to Embodiment 2. In the eight timing diagrams shown in FIG. 5, the horizontal axes are all the same time axis, and the vertical axes indicate the states of the same signals and the like as in FIG. 2. Also, the signals indicated by dashed-dotted lines represent signals that do not appear in Embodiment 2.

In Embodiment 2, it is assumed that the instruction signal received from the input terminal 10 is off, and the headlight 6 accordingly continues to be unlit. Specifically, since before a time t0 shown in FIG. 5, the switch control signal output by the microcomputer 11 has been held in the off state, and the Q terminal 235 of the flip-flop circuit 23 has been reset. Accordingly, because the AND condition of the AND gate 25 is not satisfied, the one input terminal of the NOR gate 36 is set to the low level, but because the switch control signal (off) from the microcomputer 11 is supplied to the output terminal 17 via the inverter 32 and the NOR gate 36, the switch 5 turns off and the headlight 6 continues to be unlit. Furthermore, because the microcomputer 11 has been outputting the watchdog pulse substantially periodically since before the time t0, the reset signal output by the watchdog circuit 12 has been held in the off state, and the mask signal output from the output port 113 by the microcomputer 11 has been kept in the low-level disabled state.

The operations of the units from a time t0 to a time t2 are similar to the case shown in FIG. 2 in Embodiment 1.

If the watchdog pulse that is to be output from the microcomputer 11 at a time t3 (indicated by a dashed-dotted line) is not output, the watchdog circuit 12 generates a reset signal at a time t4, for example. Accordingly, the microcomputer 11 is reset and the output port 113 enters the open drain inactive state, but since the output port 113 is pulled up by the resistor R21, the mask signal becomes enabled. Also, the reset signal is supplied to the set terminal 233 of the flip-flop circuit 23, and thus the Q terminal 235 is set.

Furthermore, due to the microcomputer 11 being reset, the output port 114 enters the open drain inactive state, but since the output port 114 is pulled up by the resistor R31, the switch control signal is set to on. In this case, the Q terminal 235 has been set, and the instruction signal is off, and therefore the AND condition of the AND gate 25 is satisfied, a low-level signal is supplied to the output terminal 17 via the NOR gate 36, the switch 5 turns off, and the headlight 6 continues to be unlit.

The operations of the units at a time t5 are similar to the case shown in FIG. 2 in Embodiment 1.

At a time t6, the microcomputer 11 starts to output a watchdog pulse. Here, if the mask signal were always disabled (shown by a dashed-dotted line), that is to say if the input terminal of the inverter 27 were always held at the low level, the output signal from the mask circuit constituted by the NAND gate 24 and the inverter 27 would fall (shown by a dashed-dotted line), this signal would be supplied to the reset terminal 234 of the flip-flop circuit 23, and the Q terminal 235 would be reset (shown by a dashed-dotted line). In this case, because the AND condition of the AND gate 25 is not satisfied, the one input terminal of the NOR gate 36 is set to the low level, and the NOR gate 36 operates simply as an inverter. However, control of the switch control signal by the microcomputer 11 would not have been resumed, and therefore a high-level signal would be supplied by the output port 114 to the output terminal 17 via the inverter 32 and the NOR gate 36, the switch 5 would turn on, and the headlight 6 would become lit (shown by a dashed-dotted line).

In other words, in Embodiment 2, the turning on of the headlight 6 when the microcomputer 11 is reset is prevented by enabling the mask signal at the time t6.

In the case where the watchdog pulse is output at a time t7 as well, a procedure similar to that in the case of being output at the time t6 is performed.

If, at a time t8, the microcomputer 11 sets the output port 113 to low active to enable the mask signal, and also sets the switch control signal output from the output port 114 to off according to the instruction signal, the switch control signal (off) is supplied to the output terminal 17 via the inverter 32 and the NOR gate 36, and thus the switch 5 turns off and the unlit state of the headlight 6 is held.

After the mask signal becomes disabled, if the watchdog pulse is output at a time t9, the NAND gate 24 of the mask circuit inverts the watchdog pulse, and the output signal from the mask circuit falls. This output signal is supplied to the reset terminal 234 of the flip-flop circuit 23, and therefore the Q terminal 235 of the flip-flop circuit 23 is reset. In this case, because the AND condition of the AND gate 25 is not satisfied, the one input terminal of the NOR gate 36 is set to the low level, and the NOR gate 36 operates simply as an inverter, but since the switch control signal has already been set to off, the switch 5 continues to be in the off state, and the unlit state of the headlight 6 is held.

The example in which the instruction signal continues to be off in the period from the time t0 to at least the time t9 shown in FIG. 5 is described in Embodiment 2, but if the instruction signal changes from off to on and from on to off in the period from when the microcomputer 11 is reset at the time t4 until when the switch control signal is set to off at the time t8, it goes without saying that the headlight 6 changes from unlit to lit and from lit to unlit according to the instruction signal.

Also, if the instruction signal continues to be on, in the period from the time t0 to the time t9, the switch control signal continues to be on without use of the mask circuit, the other input terminal of the NOR gate 36 is set to low level, and the one input terminal of the NOR gate 36 is set to low level without the AND condition of the AND gate 25 becoming satisfied, and therefore the output terminal 17 is set to the high level, and the headlight 6 continues to be lit.

As described above, according to Embodiment 2, if the microcomputer 11 loses the ability to perform control, and the watchdog pulse is no longer generated, a reset signal is supplied to the microcomputer 11, and the turning on/off state of the switch 5 is no longer controlled, but since the Q terminal 235 of the flip-flop circuit 23 is set by the reset signal, a fail-safe state is achieved in which the switch 5 is turned on/off according to the instruction signal itself, similarly to the case in Embodiment 1. In the period from when the reset of the microcomputer 11 is released and operation of the microcomputer 11 resumes, until when the microcomputer 11 starts to control the turning on/off of the switch 5 using the switch control signal, the watchdog pulse is masked by the mask circuit, and thus the Q terminal 235 of the flip-flop circuit 23 is held in the set state, and the fail-safe state continues.

Accordingly, even if the microcomputer 11 that controls the turning on/off of the switch 5 falls into an abnormal state and is reset, the switch 5 can be turned on/off according to a signal from an external device.

Also, according to Embodiment 1, the modified example of Embodiment 1, and Embodiment 2, the mask circuit and the switch 5 are respectively controlled by signals output from the output ports 113 and 114 of the microcomputer 11.

Specifically, the mask signal supplied to the mask circuit and the control signal for controlling the on/off state of the switch 5 are respectively output by the output ports 113 and 114 of the microcomputer 11, thus making it possible to simplify the circuit configuration.

Furthermore, according to Embodiment 1, the modified example of Embodiment 1, and Embodiment 2, the turning on/off of the switch 5 is instructed by the high/low state of the signal level of the instruction signal, thus making it possible to simplify the circuit configuration in comparison to the case in which the turning on/off of the switch 5 is instructed by the content of a data signal, for example.

Embodiment 3

Embodiment 1 is an embodiment that does not give consideration to the case where the power supply of the fail-safe circuit 1 is lost, whereas Embodiment 3 is an embodiment in which the object of the present invention is achieved even in the case where the power supply of the fail-safe circuit is lost.

Figure 6:
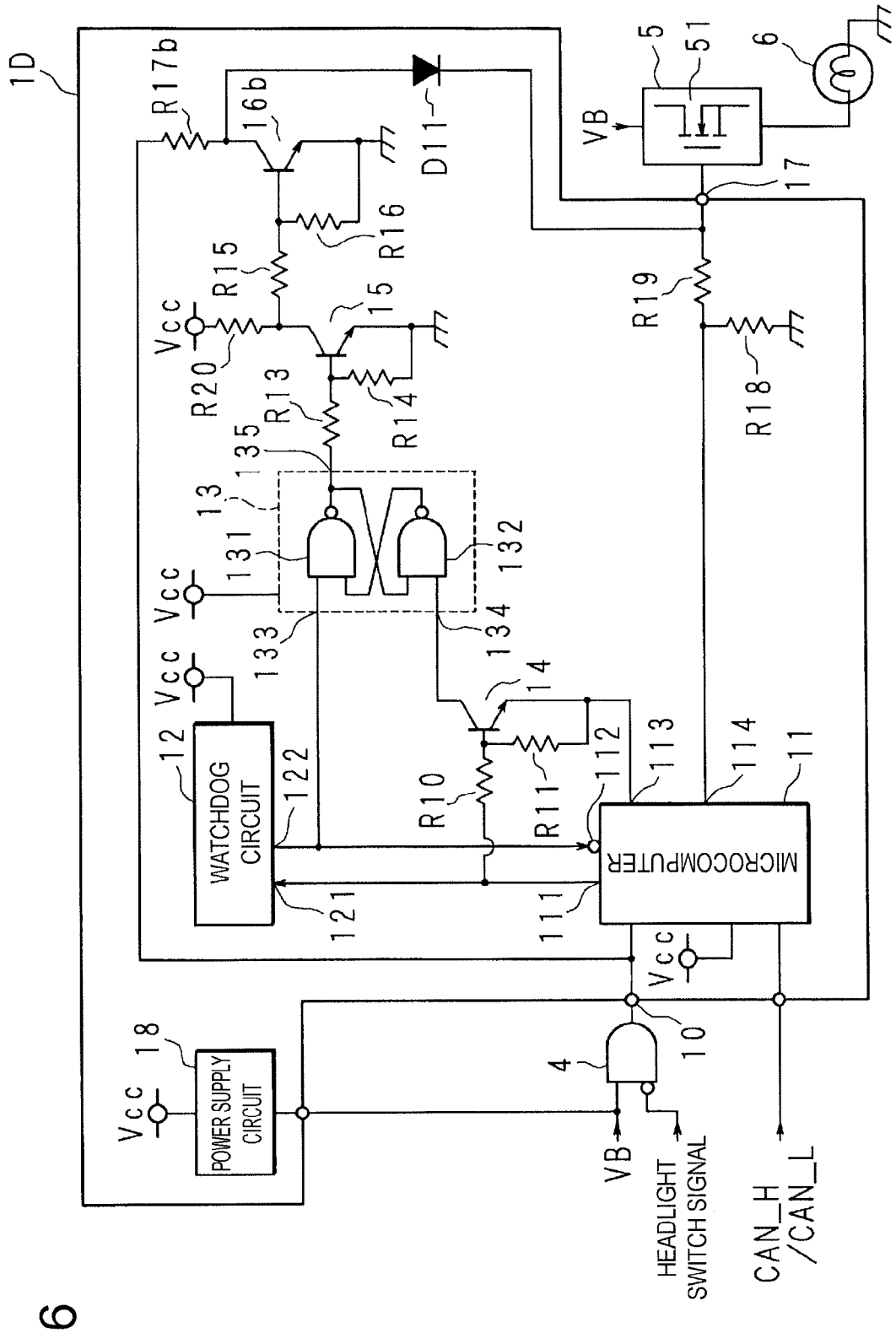
FIG. 6 is a circuit diagram showing an example of a configuration of a fail-safe circuit according to Embodiment 3 of the present application.

FIG. 6 is a circuit diagram showing an example of the configuration of a fail-safe circuit according to Embodiment 3 of the present application. 1D in this figure is a fail-safe circuit, and the fail-safe circuit 1D has the same configuration as the fail-safe circuit 1 according to Embodiment 1 of the present application with the exception of one portion, and the following description focuses on the portion that has a different configuration.

One end of the resistor R10 is connected to the output port 111 of the microcomputer 11 that outputs a watchdog pulse, and the other end is connected to the base of the NPN transistor 14. The collector of the transistor 14 is connected to the reset terminal 134 of the flip-flop circuit 13 that is constituted by the NAND gates 131 and 132. The reset terminal 134 is pulled up to the voltage of the power supply inside the NAND gate 132.

The Q terminal 135 of the flip-flop circuit 13 is connected to the base of the NPN transistor 15 via the resistor R13. The resistor R14 is connected between the base and the emitter of the transistor 15. The collector of the transistor 15 is connected to the base of an NPN transistor 16b via the resistor R15. The resistor R16 is connected between the base and the emitter of the transistor 16b. The emitter of the transistor 16b is connected to ground potential. The collector of the transistor 16b is connected to the input terminal 10 of the fail-safe circuit 1D via a resistor R17b, and receives an instruction signal from an external device via the resistor R17b. The collector of the transistor 16b is also connected to the output terminal 17 of the fail-safe circuit 1D via the forward diode D11.

The output port 114 of the microcomputer 11 is pulled down to ground potential by the resistor R18, and is connected to the output terminal 17 by the resistor R19. The resistance value of the resistor R19 is sufficiently higher than the resistance value of the resistor R17b, and the diode D11 and the resistor R19 configure an OR circuit.

The fail-safe circuit 1D also includes a power supply circuit (corresponds to a power supply) 18 that generates the 5V voltage Vcc by stepping down the in-vehicle battery voltage VB. The voltage Vcc is supplied to the microcomputer 11, the watchdog circuit 12, and the flip-flop circuit 13, and is applied to the other end of the resistor R20, whose one end is connected to the collector of the transistor 15. The power supply circuit 18 may be integrated with the watchdog circuit 12, for example.

If the Q signal output from the Q terminal 135 of the flip-flop circuit 13 rises to the high level, and the instruction signal supplied from the input terminal 10 to the collector of the transistor 16b via the resistor R17b has risen to the high level, the cascade connection circuit constituted by the transistors 15 and 16 supplies a high-level signal to the anode of the diode D11. In other words, the resistor R17b and the cascade connection circuit constituted by the transistors 15 and 16 configure an AND circuit that takes the AND of the Q signal and the instruction signal.

Other portions that correspond to Embodiment 1 are denoted by the same reference signs, and detailed descriptions will not be given for them.

Next, a fail-safe operation of the fail-safe circuit 1D will be described. A timing chart for describing operations of the fail-safe circuit 1D according to Embodiment 3 would be entirely the same as that shown in FIG. 2 of Embodiment 1 as long as the power supply circuit 18 is operating normally, and therefore the following description is given with reference to FIG. 2.

In Embodiment 3, it is assumed that the instruction signal received from the input terminal 10 is on, and the headlight 6 accordingly continues to be lit. Specifically, since before the time t0 shown in FIG. 2, the switch control signal output by the microcomputer 11 has been held in the on state (high level), and the Q terminal 135 of the lip-flop circuit 13 has been reset. Accordingly, the AND condition of the AND circuit constituted by the resistor R17b and the cascade connection circuit constituted by the transistors 15 and 16b is not satisfied, and therefore the diode D11 becomes non-conductive, but since the switch control signal (on) from the microcomputer 11 is supplied to the output terminal 17 via the resistor R19, the switch 5 is turned on, and the headlight 6 continues to be lit. Furthermore, because the microcomputer 11 has been outputting the watchdog pulse substantially periodically since before the time t0, the reset signal output by the watchdog circuit 12 has been held in the off state, and the mask signal output from the output port 113 by the microcomputer 11 has been kept in the low-level disabled state.

The operations of the units from the time t1 to t3 are entirely the same as those in the case of Embodiment 1, and therefore descriptions will not be given for them.

If the watchdog circuit 12 generates the reset signal at the time t4, the microcomputer 11 is reset, the output port 113 is set to the low level, and the mask signal is held in the disabled state. Also, the reset signal is supplied to the set terminal 133 of the flip-flop circuit 13, and thus the Q terminal 135 is set.

Furthermore, due to the microcomputer 11 being reset, the output port 114 is set to the low level, and the switch control signal is set to off. Here, even if the output port 114 temporarily enters a high impedance state due to the microcomputer 11 being reset, the output port 114 is pulled down to the low level by the resistor R18, and the switch control signal is set to off. In this case, since the Q terminal 135 has been set and the instruction signal is on, the AND condition of the AND circuit constituted by the resistor R17b and the cascade connection circuit constituted by the transistors 15 and 16b is satisfied and the diode D11 becomes conductive, and therefore a high-level signal is supplied to the output terminal 17, the switch 5 turns on, and the headlight 6 continues to be lit.

At the time t5, the reset signal output by the watchdog circuit 12 is set to off, the microcomputer 11 whose reset was released starts initialization and sets the output port 113 to the high level, and thus the mask signal becomes enabled.

At the time t6, the microcomputer 11 starts to output a watchdog pulse. Here, if the mask signal were always disabled (shown by a dashed-dotted line), that is to say if the emitter of the transistor 14 were always held at the low level, the output signal from the mask circuit constituted by the transistor 14 would fall (shown by a dashed-dotted line), this signal would be supplied to the reset terminal 134 of the flip-flop circuit 13, and the Q terminal 135 would be reset (shown by a dashed-dotted line). In this case, the diode D11 would become nonconductive due to the AND condition of the AND circuit constituted by the resistor R17b and the cascade connection circuit constituted by the transistors 15 and 16b not being satisfied. However, control of the switch control signal by the microcomputer 11 would not have been resumed, and therefore a low-level signal would be supplied by the output port 114 to the output terminal 17 via the resistor R19, the switch 5 would turn off, and the headlight 6 would become unlit (shown by a dashed-dotted line).

In other words, in Embodiment 3, the turning off of the headlight 6 when the microcomputer 11 is reset is prevented by enabling the mask signal at the time t6.

In the case where the watchdog pulse is output at the time t7 as well, a procedure similar to that in the case of being output at the time t6 is performed.

If, at the time t8, the microcomputer 11 sets the output port 113 to low active to disable the mask signal, and also sets the switch control signal output from the output port 114 to on according to the instruction signal, the switch control signal is supplied to the output terminal 17 via the resistor R19, and thus the switch 5 turns on and the lit state of the headlight 6 is held.

After the mask signal becomes disabled, if the watchdog pulse is output at the time t9, the mask circuit constituted by the transistor 14 performs inversion amplification on the watchdog pulse, and the output signal from the mask circuit falls. This output signal is supplied to the reset terminal 134 of the flip-flop circuit 13, and therefore the Q terminal 135 of the flip-flop circuit 13 is reset. In this case, the diode D11 becomes nonconductive due to the AND condition of the AND circuit constituted by the resistor R17b and the cascade connection circuit constituted by the transistors 15 and 16b not being satisfied, but since the switch control signal has already been set to on, the switch 5 continues to be on, and the lit state of the headlight 6 is held.

The example in which the instruction signal continues to be on in the period from the time t0 to at least the time t9 shown in FIG. 2 is described in Embodiment 3, but if the instruction signal changes from on to off and from off to on in the period from when the microcomputer 11 is reset at the time t4 until when the switch control signal is set to on at the time t8, it goes without saying that the headlight 6 changes from lit to unlit and from unlit to lit according to the instruction signal.

Also, if the instruction signal continues to be off, in the period from the time t0 to the time t9, the switch control signal continues to be off without use of the mask circuit, and the diode D11 becomes nonconductive without the AND condition of the AND circuit constituted by the resistor R17b and the cascade connection circuit constituted by the transistors 15 and 16b becoming satisfied, and therefore the output terminal 17 is set to the low level, and the headlight 6 continues to be unlit.

If the power supply circuit 18 stops generating the voltage Vcc for a reason such as a malfunction, the microcomputer 11 loses the ability to hold the switch control signal output from the output port 114 in the on state. At the same time, the voltage Vcc is no longer supplied to the flip-flop circuit 13, and the Q terminal 135 enters the low level or high impedance state. In this case, the voltage Vcc for supplying a base current to the transistor 16b via the resistors R20 and R15 is lost and the transistor 16b turns off, and thus the instruction signal (on) received from the input terminal 10 via the resistor R17b is supplied to the output terminal 17 via the diode D11, and the on state of the switch 5 is held.

If the instruction signal is set to off in this period, the diode D11 becomes nonconductive, but since the output terminal 17 is pulled down to ground potential by the resistors R18 and R19, the switch 5 turns off, and the headlight 6 turns off. In other words, even if the 5V power supply is lost, the headlight 6 turns on/off according to the on/off state of the instruction signal.

As described above, according to Embodiment 3, the on/off state of the switch 5 constituted by a semiconductor relay is instructed by an instruction signal from the external AND gate 4, and the microcomputer 11 controls the turning on/off of the switch 5 and generates a watchdog pulse based on the instruction signal and a predetermined monitoring signal. If the microcomputer 11 is reset by a reset signal generated by the watchdog circuit 12 based on the watchdog pulse, the Q terminal 135 of the flip-flop circuit 13 is set. The Q terminal 135 of the flip-flop circuit 13 is reset by a watchdog pulse obtained by inversion amplification performed by the mask circuit. In the period from when the reset is released until when control of the on/off state of the switch 5 starts, the microcomputer 11 outputs the mask signal from the output port 113, and masks the watchdog pulse using the mask circuit. In the case where the Q terminal 135 of the flip-flop circuit 13 is set by the reset signal, and in the case where the voltage Vcc for the flip-flop circuit 13 is lost, the switch 5 is turned on/off according to the instruction signal, independently of control performed by the microcomputer 11.

Specifically, if the microcomputer 11 loses the ability to perform control, and the watchdog pulse is no longer generated, a reset signal is supplied to the microcomputer 11, and the turning on/off of the switch 5 is no longer controlled, but since the Q terminal 135 of the flip-flop circuit 13 is set by the reset signal, a fail-safe state is achieved in which the switch 5 is turned on/off according to the instruction signal itself. In the period from when the reset of the microcomputer 11 is released and operation of the microcomputer 11 resumes, until when the microcomputer 11 starts to control the turning on/off of the switch 5 using the switch control signal, the watchdog pulse is masked by the mask circuit, and thus the Q terminal 135 of the flip-flop circuit 13 is held in the set state, and the fail-safe state continues. Additionally, even if the flip-flop circuit 13 stops being set due to the voltage Vcc no longer being supplied to the flip-flop circuit 13, the switch 5 is turned on/off according to the instruction signal itself.

Accordingly, in the case where the microcomputer 11 that controls the turning on/off of the switch 5 falls into an abnormal state and is reset, and in the case where the power supply for the circuit that backs up the control of the switch 5 is lost, the switch 5 can be turned on/off according to a signal from an external device.

Modified Example

Embodiment 3 is an embodiment configured using the transistors 14, 15, and 16b that are active components, whereas this modified example of Embodiment 3 is an embodiment configured without including transistors.

Figure 7:
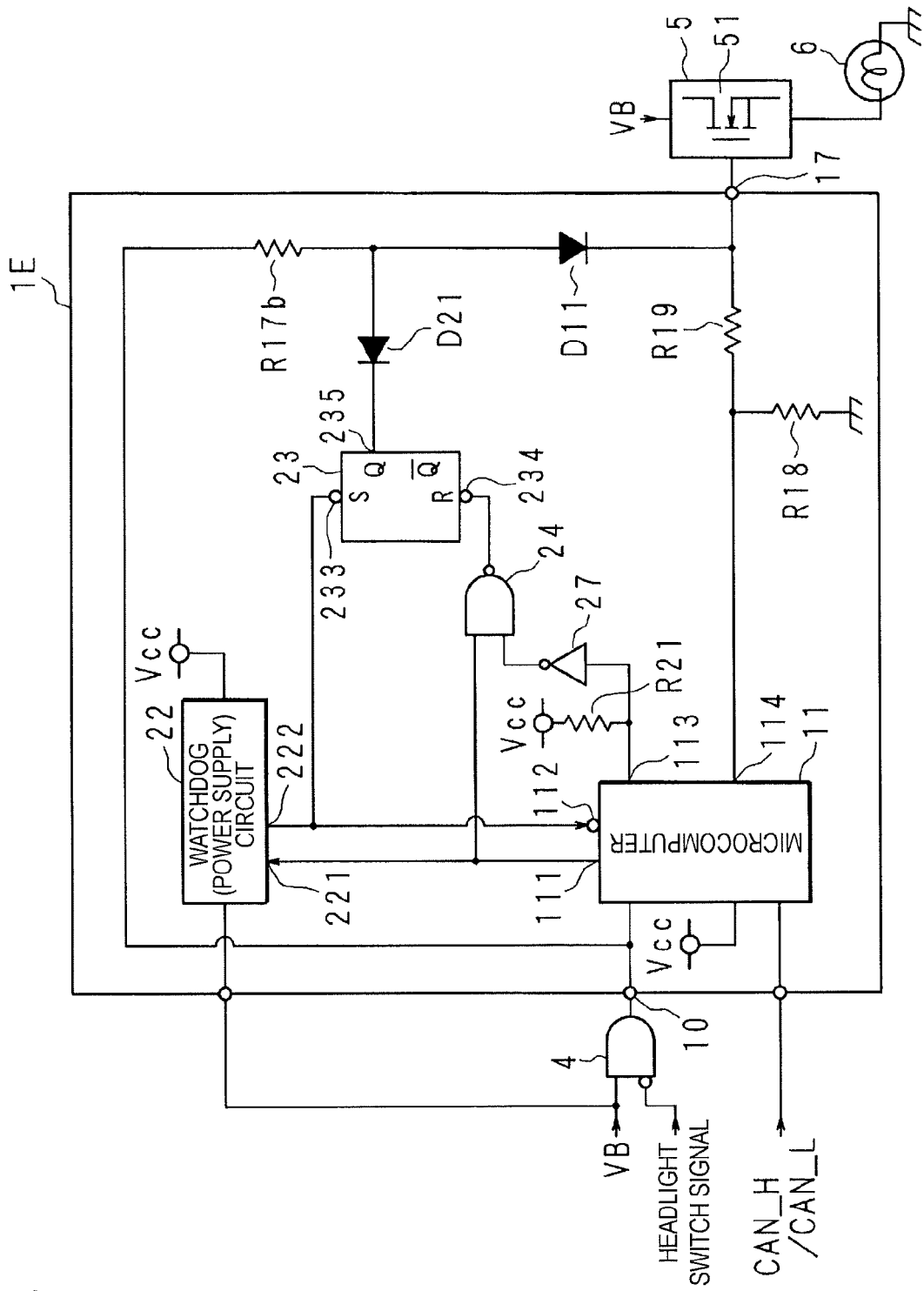
FIG. 7 is a circuit diagram showing an example of a configuration of a fail-safe circuit according to a modified example of Embodiment 3 of the present application.

FIG. 7 is a circuit diagram showing an example of the configuration of a fail-safe circuit according to this modified example of Embodiment 3. 1E in this figure is a fail-safe circuit, and the fail-safe circuit 1E includes the microcomputer 11 that controls the turning on/off of the switch 5, which is constituted by a semiconductor relay, based on an instruction signal received from the external AND gate 4 via the input terminal 10, a watchdog (power supply) circuit 22 that generates a low-active reset signal based on a high-active watchdog pulse generated by the microcomputer 11, and the flip-flop circuit 23 that is constituted by an SR flip-flop. The watchdog (power supply) circuit 22 additionally includes the functionality of a power supply circuit, and generates the 5V voltage Vcc by stepping down the in-vehicle battery voltage VB supplied from the outside.

The output port 111 of the microcomputer 11, which outputs a watchdog pulse, is connected to an input terminal 221 of the watchdog (power supply) circuit 22 and the one input terminal of the NAND gate 24. An output terminal 222 of the watchdog (power supply) circuit 22, which outputs a reset signal, is connected to the reset terminal 112 of the microcomputer 11 and the set terminal 233 of the flip-flop circuit 23. The output terminal of the NAND gate 24 is connected to the reset terminal 234 of the flip-flop circuit 23.

The Q terminal 235 of the flip-flop circuit 23 is connected to the cathode of a diode D21. The anode of the diode D21 is connected to the input terminal 10 of the fail-safe circuit 1E via the resistor R17b, and receives an instruction signal from an external device. The connection point between the anode of the diode D21 and the resistor R17b is connected to the output terminal 17 of the fail-safe circuit 1E via the forward diode D11.

The output port 113 of the microcomputer 11 is pulled up to a voltage Vcc by a resistor R21, and is connected to the other input terminal of the NAND gate 24 via an inverter 27. The output port 114 of the microcomputer 11 is pulled down to ground potential by the resistor R18, and is connected to the output terminal 17 by the resistor R19. The resistance value of the resistor R19 is sufficiently higher than the resistance value of the resistor R17b, and the diode D11 and the resistor R19 configure an OR circuit similarly to the case in FIG. 6 of Embodiment 3.

On the other hand, if the Q signal output from the Q terminal 235 of the flip-flop circuit 23 rises to the high-level, and the instruction signal received from the input terminal 10 via the resistor R17b has risen to the high level, the connection point between the anode of the diode D21 and the resistor R17b rises to the high level. In other words, the diode D21 and the resistor R17b configure an AND circuit that takes the AND of the Q signal and the instruction signal.

The voltage Vcc generated by the watchdog (power supply) circuit 22 is supplied to the microcomputer 11, the flip-flop circuit 23, the NAND gate 24, and the inverter 27, and is also applied to the other end of the resistor R21 whose one end is connected to the output port 113 of the microcomputer 11. The watchdog (power supply) circuit 22 may be divided into the power supply circuit 18 and the watchdog circuit 12 used in Embodiment 1.

Operations related to the NAND gate 24, the inverter 27, and the flip-flop circuit 23 are the same as in the description given using FIG. 3 in the modified example of Embodiment 1, and therefore descriptions will not be given for them.

Other portions that correspond to Embodiment 3 are denoted by the same reference signs, and detailed descriptions will not be given for them.

The above-described fail-safe circuit 1E is the fail-safe circuit 1D shown in FIG. 6 of Embodiment 3, in which the mask circuit constituted by the transistor 14 has been replaced with the NAND gate 24 and the inverter 27, the AND circuit constituted by the resistor R17b and the cascade connection circuit constituted by the transistors 15 and 16b has been replaced with an AND circuit constituted by the diode D21 and the resistor R17b, and furthermore the flip-flop circuit 13 constituted by the NAND gates 131 and 132 has been replaced with the flip-flop circuit 23 constituted by an SR flip-flop. Accordingly, as long as the voltage Vcc is being generated by the watchdog (power supply) circuit 22, the fail-safe operation realized by the fail-safe circuit 1E is entirely the same as in the case described using FIG. 6 in Embodiment 3.

If the watchdog (power supply) circuit 22 stops generating the voltage Vcc for a reason such as a malfunction, the voltage Vcc is no longer supplied to the flip-flop circuit 23, and the Q terminal 235 enters the low-level or high impedance state, similarly to the case in Embodiment 1. Here, the Q terminal 235 of the flip-flop circuit 23 has a so-called output tolerant function, and even if the supplied power supply voltage is 0 V, a current does not flow from the outside to the Q terminal 235. Accordingly, the instruction signal (on) received from the input terminal 10 via the resistor R17b and the diode D11 is supplied to the output terminal 17, and the on state of the switch 5 is held.

If the instruction signal is set to off in this period, the diode D11 becomes nonconductive, but since the output terminal 17 is pulled down to ground potential by the resistors R18 and R19, the switch 5 turns off, and the headlight 6 turns off. In other words, even if the 5V power supply is lost, the headlight 6 turns on/off according to the on/off state of the instruction signal.

As described above, this modified example of Embodiment 3 can achieve effects similar to those of the fail-safe circuit 1D according to Embodiment 3.

Embodiment 4

Embodiment 3 and the modified example thereof are embodiments in which the output port 114 of the microcomputer 11 is pulled down to ground potential by the resistor R18, and the turning off of the headlight 6 when the microcomputer 11 is reset is prevented. However, Embodiment 4 is an embodiment in which the output port 114 of the microcomputer 11 is an open drain (or an open collector) and is pulled up by another resistor, and the turning on of the headlight 6 when the microcomputer 11 is reset is prevented. In Embodiment 4, it is assumed that the output port 113 is also an open drain (or an open collector).

Figure 8:
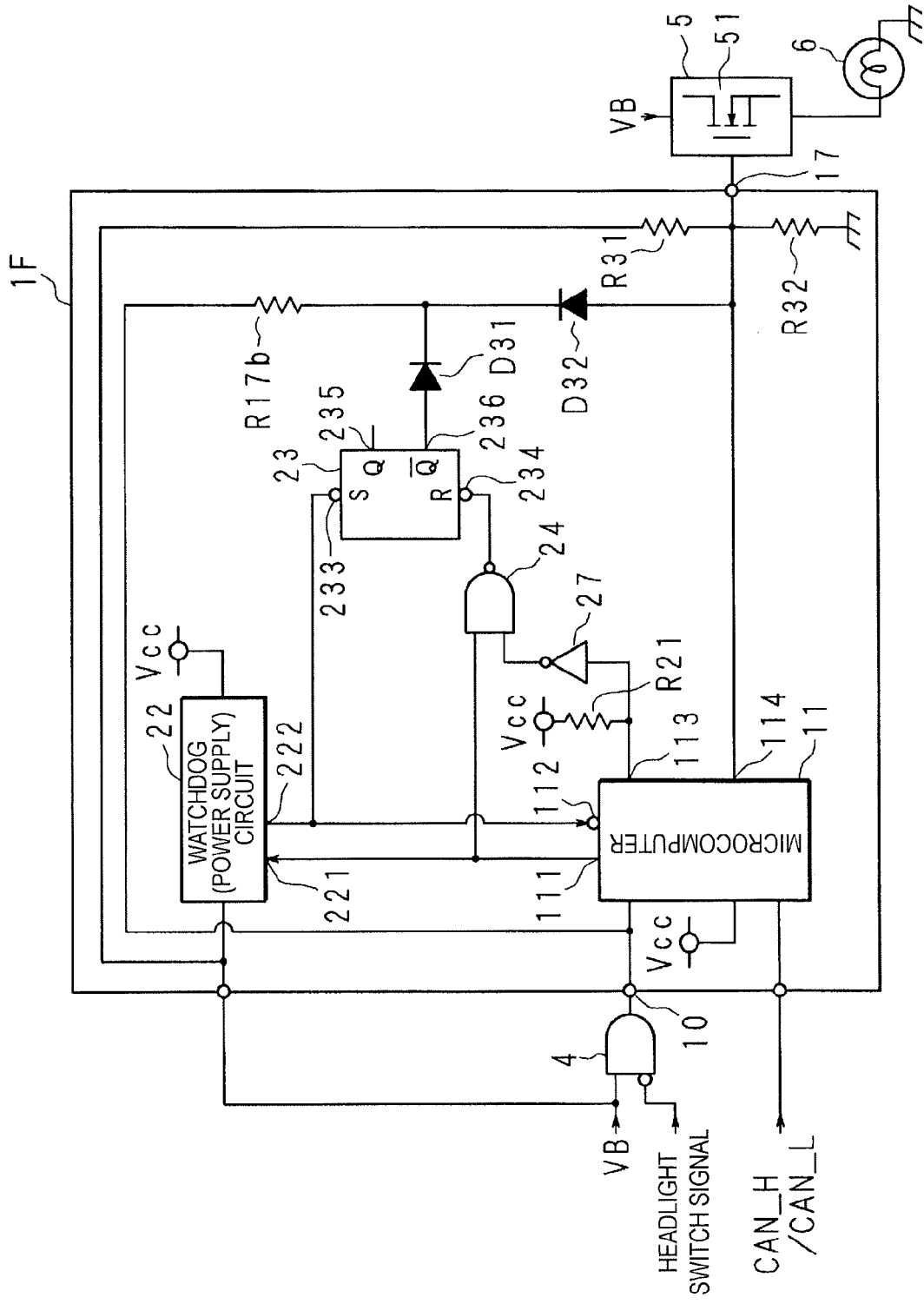
FIG. 8 is a circuit diagram showing an example of a configuration of a fail-safe circuit according to Embodiment 4 of the present application.
Figure 9:
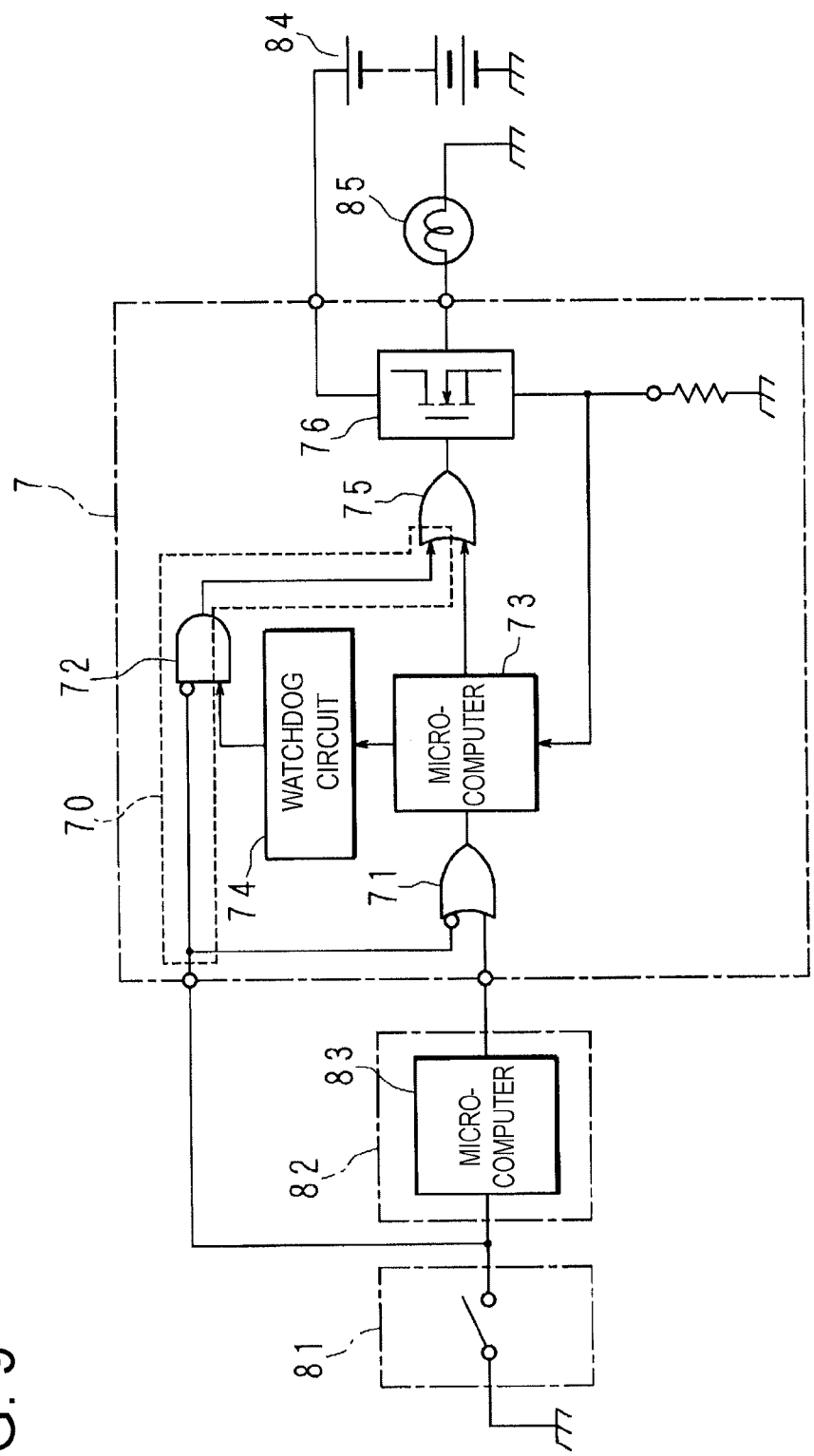
FIG. 9 is a circuit diagram showing the configuration of a conventional backup system according to JP 2009-261153A.

FIG. 8 is a circuit diagram showing an example of the configuration of a fail-safe circuit according to Embodiment 4 of the present application. 1F in this figure is a fail-safe circuit, and the fail-safe circuit 1F includes the microcomputer 11 that controls the turning on/off of the switch 5, which is constituted by a semiconductor relay, based on an instruction signal received from the external AND gate 4 via the input terminal 10, the watchdog (power supply) circuit 22 that generates a low-active reset signal based on a high-active watchdog pulse generated by the microcomputer 11, and the flip-flop circuit 23 that is constituted by an SR flip-flop. The watchdog (power supply) circuit 22 generates the 5V voltage Vcc by stepping down the in-vehicle battery voltage VB.

The output port 111 of the microcomputer 11, which outputs a watchdog pulse, is connected to the input terminal 221 of the watchdog (power supply) circuit 22 and the one input terminal of the NAND gate 24. The output terminal 222 of the watchdog (power supply) circuit 22, which outputs a reset signal, is connected to the reset terminal 112 of the microcomputer 11 and the set terminal 233 of the flip-flop circuit 23. The output terminal of the NAND gate 24 is connected to the reset terminal 234 of the flip-flop circuit 23.

An inverting output terminal (hereinafter, called a Q bar terminal) 236 of the flip-flop circuit 23 is connected to the anode of a diode D31. The cathode of the diode D31 is connected to the input terminal 10 of the fail-safe circuit 1F via the resistor R17b, and receives an instruction signal from an external device via the resistor R17b. The connection point between the cathode of the diode D31 and the resistor R17b is connected to the output terminal 17 of the fail-safe circuit 1F via a reverse diode D32.

The output port 113 of the microcomputer 11, which is an open drain (or open collector), is pulled up to the voltage Vcc by the resistor R21, and is connected to the other input terminal of the NAND gate 24 via the inverter 27. The output port 114 of the microcomputer 11, which is an open drain (or open collector), is pulled up to a voltage (e.g., approximately 5 V) obtained by dividing the voltage VB in a voltage dividing circuit constituted by resistors R31 and R32, and is connected to the output terminal 17.

If the Q bar signal output from the Q bar terminal 236 of the flip-flop circuit 23 rises to the high level, or the instruction signal received from the input terminal 10 via the resistor R17b has risen to the high level, the connection point between the diode D31 and the resistor R17b rises to the high level. In other words, the diode D31 and the resistor R17b configure an OR circuit that takes the OR of the Q bar signal and the instruction signal.

On the other hand, the parallel resistance value of the resistors R31 and R32 is sufficiently higher than the resistance value of the resistor R17b, and if the OR condition of the OR circuit constituted by the diode D31 and the resistor R17b is not satisfied, the diode D32 supplies a low-level signal to the output terminal 17.

Other portions that correspond to Embodiment 3 and the modified example thereof are denoted by the same reference signs, and detailed descriptions will not be given for them.

The above-described fail-safe circuit 1F is the fail-safe circuit 1E shown in FIG. 7 of the modified example of Embodiment 3, in which the diode D31 having a different polarity from the diode D21 has been connected to the Q bar terminal 236, the diode D11 has been replaced with the diode D32 that has a different polarity, the resistor R18 that pulls down the output port 114 of the microcomputer 11 has been replaced with the pull-up resistors R31 and R32, and furthermore the resistor R19 has been replaced with a line.

Next, a fail-safe operation of the fail-safe circuit 1F will be described. A timing chart for describing operations of the fail-safe circuit 1F according to Embodiment 4 would ultimately be entirely the same as that shown in FIG. 5 of Embodiment 2 as will be described below, and therefore the following description is given with reference to FIG. 5.

In Embodiment 4, it is assumed that the instruction signal received from the input terminal 10 is off, and the headlight 6 accordingly continues to be unlit. Specifically, since before the time t0 shown in FIG. 5, the switch control signal output by the microcomputer 11 has been held in the off state, the Q terminal 235 of the flip-flop circuit 23 has been reset, and the signal level at the Q bar terminal 236 is high. Accordingly, the OR condition of the OR circuit constituted by the diode D31 and the resistor R17b is satisfied, and the diode D32 becomes nonconductive, but since the switch control signal (off) from the microcomputer 11 is supplied to the output terminal 17, the switch 5 turns off, and the headlight 6 continues to be unlit. Furthermore, because the microcomputer 11 has been outputting the watchdog pulse substantially periodically since before the time t0, the reset signal output by the watchdog (power supply) circuit 22 has been held in the off state, and the mask signal output from the output port 113 by the microcomputer 11 has been held in the low-level disabled state.

The operations of the units from the time t0 to the time t2 are similar to the case shown in FIG. 3 in Embodiments 1 and 3.

If the watchdog pulse that is to be output from the microcomputer 11 at the time t3 (indicated by a dashed-dotted line) is not output, the watchdog (power supply) circuit 22 generates a reset signal at the time t4, for example. Accordingly, the microcomputer 11 is reset and the output port 113 enters the open drain inactive state, but since the output port 113 is pulled up by the resistor R21, the mask signal becomes enabled. Also, the reset signal is supplied to the set terminal 233 of the flip-flop circuit 23, and thus the Q terminal 235 is set, and the signal level at the Q bar terminal 236 is set to low.

Furthermore, due to the microcomputer 11 being reset, the output port 114 enters the open drain inactive state, but since the output port 114 is pulled up by the voltage obtained by dividing the voltage VB using the resistors R31 and R32, the switch control signal is set to on. In this case, since the signal level at the Q bar terminal 236 is low, and the instruction signal is off, the diode D32 becomes conductive without the OR condition of the OR circuit constituted by the diode D31 and the resistor R17b being satisfied, and thus a low level signal is supplied to the output terminal 17, the switch 5 turns off, and the headlight 6 continues to be in the unlit state.

The operations of the units at the time t5 are similar to the case shown in FIG. 2 in Embodiments 1 and 3.

At the time t6, the microcomputer 11 starts to output a watchdog pulse. Here, if the mask signal were always disabled (shown by a dashed-dotted line), that is to say if the input terminal of the inverter 27 were always held at the low level, the output signal from the mask circuit constituted by the NAND gate 24 and the inverter 27 would fall (shown by a dashed-dotted line), this signal would be supplied to the reset terminal 234 of the flip-flop circuit 23, and the signal level at the Q bar terminal 236 would be set to high (shown by a dashed-dotted line). In this case, the OR condition of the OR circuit constituted by the diode D31 and the resistor R17b would be satisfied, and the diode D32 would become nonconductive.

However, control of the switch control signal by the microcomputer 11 would not have been resumed, and therefore the output port 114 would continue to be in the open drain inactive state, the voltage obtained by dividing the voltage VB using the resistors R31 and R32 would be supplied to the output terminal 17, the switch 5 would turn on, and the headlight 6 would become lit (shown by a dashed-dotted line).

In other words, in Embodiment 4, the turning on of the headlight 6 when the microcomputer 11 is reset is prevented by enabling the mask signal at the time t6.

In the case where the watchdog pulse is output at the time t7 as well, a procedure similar to that in the case of being output at the time t6 is performed.

If, at a time t8, the microcomputer 11 sets the output port 113 to low active to enable the mask signal, and also sets the switch control signal output from the output port 114 to off according to the instruction signal, the switch control signal (off) is supplied to the output terminal 17, and thus the switch 5 turns off and the unlit state of the headlight 6 is held.

After the mask signal becomes disabled, if the watchdog pulse is output at the time t9, the NAND gate 24 of the mask circuit inverts the watchdog pulse, and the output signal from the mask circuit falls. This output signal is supplied to the reset terminal 234 of the flip-flop circuit 23, and therefore the signal level at the Q bar terminal 236 of the flip-flop circuit 23 is set to high. In this case, the OR condition of the OR circuit constituted by the diode D31 and the resistor R17b is satisfied, and the diode D32 becomes nonconductive, but since the switch control signal has already been set to off, the switch 5 continues to be off, and the unlit state of the headlight 6 is held.

The example in which the instruction signal continues to be off in the period from the time t0 to at least the time t9 shown in FIG. 5 is described in Embodiment 4, but if the instruction signal changes from off to on and from on to off in the period from when the microcomputer 11 is reset at the time t4 until when the switch control signal is set to off at the time t8, it goes without saying that the headlight 6 changes from unlit to lit and from lit to unlit according to the instruction signal.

Also, if the instruction signal continues to be on, in the period from the time t0 to the time t9, the switch control signal continues to be on without use of the mask circuit, the OR condition of the OR circuit constituted by the diode D31 and the resistor R17b is satisfied, and the diode D32 becomes nonconductive, and therefore the output terminal 17 is set to the high level, and the headlight 6 continues to be lit.

If the watchdog (power supply) circuit 22 stops generating the voltage Vcc for a reason such as a malfunction, the voltage Vcc is no longer supplied to the flip-flop circuit 23, the Q bar terminal 236 enters the low-level or high impedance state, and the diode D31 becomes nonconductive. Here, the output port 114 of the microcomputer 11 has a so-called output tolerant function, and even if the supplied power supply voltage is 0 V, a current does not flow from the voltage VB voltage dividing circuit constituted by the resistors R31 and R32 to the output port 114. Accordingly, the instruction signal (off) received from the input terminal 10 via the resistor R17b and the diode D31 is supplied to the output terminal 17, and the off state of the switch 5 is held.

If the instruction signal is set to on in this period, the diode D32 also becomes nonconductive, but the voltage obtained by dividing the voltage VB using the resistors R31 and R32 is supplied to the output terminal 17, the switch 5 turns on, and the headlight 6 turns on. In other words, even if the 5V power supply is lost, the headlight 6 turns on/off according to the on/off state of the instruction signal.

As described above, according to Embodiment 4, if the microcomputer 11 loses the ability to perform control, and the watchdog pulse is no longer generated, a reset signal is supplied to the microcomputer 11, and the turning on/off of the switch 5 is no longer controlled, but since the Q terminal 235 of the flip-flop circuit 23 is set by the reset signal, a fail-safe state is achieved in which the switch 5 is turned on/off according to the instruction signal itself, similarly to the case in Embodiment 3. In the period from when the reset of the microcomputer 11 is released and operation of the microcomputer 11 resumes, until when the microcomputer 11 starts to control the turning on/off of the switch 5 using the switch control signal, the watchdog pulse is masked by the mask circuit, and thus the Q terminal 235 of the flip-flop circuit 23 is held in the set state, and the fail-safe state continues. Additionally, even if the flip-flop circuit 23 stops being set due to the voltage Vcc no longer being supplied to the flip-flop circuit 23, the switch 5 is turned on/off according to the instruction signal itself.

Accordingly, in the case where the microcomputer 11 that controls the turning on/off of the switch 5 falls into an abnormal state and is reset, and in the case where the power supply for the circuit that backs up the control of the switch 5 is lost, the switch 5 can be turned on/off according to a signal from an external device.

Also, according to Embodiment 3, the modified example of Embodiment 3, and Embodiment 4, the microcomputer 11, the watchdog circuit 12, the watchdog (power supply) circuit 22, and the flip-flop circuit 23 receive a supply of power from the same voltage Vcc, and therefore the overall power supply system is simplified, the behavior when the power supply is lost is clear, and the circuit for ensuring the fail-safe operation can be simplified.

Furthermore, according to Embodiment 3, the modified example of Embodiment 3, and Embodiment 4, the mask circuit and the switch are respectively controlled by signals output from the output ports 113 and 114 of the microcomputer 11.

Specifically, the mask signal supplied to the mask circuit and the control signal for controlling the on/off state of the switch 5 are respectively output by the output ports 113 and 114 of the microcomputer 11, thus making it possible to simplify the circuit configuration. Also, since the behavior of the control circuit that includes the microcomputer 11 when the power supply is lost is clear, the circuit for ensuring the fail-safe operation can be simplified.

Although specific embodiments have been illustrated and described herein, those of ordinary skill in the art appreciate that any arrangement which is calculated to achieve the same purpose may be substituted for the specific embodiments shown and that embodiments of the invention have other applications in other environments. The present application is intended to cover any adaptations or variations of the present inventions.

The following claims are in no way intended to limit the scope of embodiments of the invention to the specific embodiments described herein.

REFERENCE SIGNS LIST 1, 1B, 1C, 1D, 1E, 1F Fail-safe circuit
10 Input terminal
11 Microcomputer (microcomputer)
114 Output port
12 Watchdog circuit
13 Flip-flop circuit
14 Transistor (mask circuit)
17 Output terminal
22 Watchdog (power supply) circuit
23 Flip-flop circuit
24 NAND gate (one portion of mask circuit)
27 Inverter (other portion of mask circuit)
5 Switch
6 Headlight

The invention claimed is:

1. A fail-safe circuit comprising a controller that controls a turning on/off of a switch based on and external instruction signal instructing turning on/off of the switch, and a watchdog circuit that generates a reset signal for resetting the controller based on a watchdog pulse generated by the controller, the fail-safe circuit performing a fail-safe operation based on the reset signal generated by the watchdog circuit, the fail-safe circuit comprising:
   a flip-flop circuit that is respectively set and reset upon receiving the reset signal and the watchdog pulse; and
   a mask that masks the watchdog pulse that is to be input to the flip-flop circuit,
   wherein in a case of being reset by the reset signal, the controller masks the watchdog pulse using the mask from when the reset is released until starting to control a turning on/off of the switch, and
   in a case where the flip-flop circuit has been set by the reset signal, and in a case where a power supply for supplying power to the flip-flop circuit has been turned off, the switch is turned on/off according to the instruction signal.

2. The fail-safe circuit according to claim 1, wherein the controller and the watchdog circuit receive a supply of power from the power supply.

3. The fail-safe circuit according to claim 1,
   wherein the controller includes a microcomputer, and
   the mask and the switch are respectively controlled by signals output from output ports of the microcomputer.

4. The fail-safe circuit according to claim 2, wherein the instruction signal is a signal indicating a turning on/off of the switch according to a signal level.

5. The fail-safe circuit according to claim 2,
   wherein the controller includes a microcomputer, and
   the mask and the switch are respectively controlled by signals output from output ports of the microcomputer.

6. The fail-safe circuit according to claim 2, wherein the instruction signal is a signal indicating a turning on/off of the switch according to a signal level.

7. The fail-safe circuit according to claim 3, wherein the instruction signal is a signal indicating a turning on/off of the switch according to a signal level.

8. The fail-safe circuit according to claim 1, wherein the flip-flop circuit includes a first NAND gate and a second NAND gate.

9. The fail-safe circuit according to claim 1, wherein the flip-flop circuit includes a Q terminal that, if set by the reset signal, enables the switch to turn on/off according to the instruction signal, when the controller fails to exercise control.

10. The fail-safe circuit according to claim 1, wherein the flip-flop circuit includes a Q terminal that is configured to be set by the reset signal and to enable the switch to turn on/off according to the instruction signal.

* * * * *